(12) United States Patent
Kanno et al.

(10) Patent No.: US 8,320,100 B2
(45) Date of Patent: Nov. 27, 2012

(54) VARACTOR ELEMENT AND ELECTRONIC DEVICE

(75) Inventors: Masayoshi Kanno, Kanagawa (JP); Kazutaka Habu, Tokyo (JP); Noritaka Sato, Kanagawa (JP)

(73) Assignee: Sony Corporation, Tokyo (JP)

(*) Notice: Subject to any disclaimer, the term of this patent is extended or adjusted under 35 U.S.C. 154(b) by 266 days.

(21) Appl. No.: 12/755,768

(22) Filed: Apr. 7, 2010

(65) Prior Publication Data
US 2010/0259864 A1    Oct. 14, 2010

(30) Foreign Application Priority Data
Apr. 13, 2009 (JP) ................ P2009-097276

(51) Int. Cl.
*H01G 5/00* (2006.01)
(52) U.S. Cl. ........ 361/277; 361/272; 361/278; 361/279; 361/290; 361/292

(58) Field of Classification Search ............ 361/277, 361/272–273, 278–281, 283.3, 290–292
See application file for complete search history.

(56) References Cited

U.S. PATENT DOCUMENTS

| | | | | |
|---|---|---|---|---|
| 4,636,824 A | * | 1/1987 | Ikoma et al. | 257/365 |
| 5,771,148 A | * | 6/1998 | Davis | 361/281 |
| 6,661,069 B1 | * | 12/2003 | Chinthakindi et al. | 257/415 |
| 2009/0257167 A1 | * | 10/2009 | Kanno et al. | 361/278 |

FOREIGN PATENT DOCUMENTS
JP    7-66077    3/1995
JP    2007-287996    11/2007

* cited by examiner

*Primary Examiner* — Nguyen T Ha
(74) *Attorney, Agent, or Firm* — K&L Gates LLP

(57) ABSTRACT

A varactor element, includes: a dielectric layer; a pair of signal electrodes, each disposed on one face of the dielectric layer and facing each other; and a pair of control electrodes, each disposed on another face of the dielectric layer and facing each other parallel to a direction intersecting a direction of the pair of signal electrodes facing each other.

5 Claims, 22 Drawing Sheets

VARACTOR ELEMENT AND ELECTRONIC DEVICE

CROSS REFERENCES TO RELATED APPLICATIONS

The present application claims priority to Japanese Priority Patent Application JP 2009-097276 filed in the Japan Patent Office on Apr. 13, 2009, the entire content of which is hereby incorporated by reference.

BACKGROUND

The present application relates to a varactor element and an electronic device provided with the same, and more specifically, to a varactor element that changes the capacitance by applying a control field and an electronic device provided with the same.

In the past, varactor elements are utilized that apply a bias signal from outside and change the capacitance to control frequencies, time, and the like. As such varactor elements, varactor diodes (variable capacitance diodes) and MEMS (micro electro mechanical systems) are commercialized, for example. Such a varactor element used for these applications usually has two terminals and does not have a terminal exclusively for application of a controlling bias signal that controls the capacitance. Therefore, in an actual circuit, such two-terminal varactor elements are arranged to function as a four-terminal element.

FIGS. 27A and 27B illustrate an example of a circuit configuration when a two-terminal varactor element is arranged to function as a four-terminal element. In an example illustrated in FIG. 27A, a varactor element 160 (varactor capacitor) has one of the terminals connected to one of the input/output terminals of the alternating current signal via a bias removal capacitor 161 and also connected to an input terminal of the control voltage via a current limiting resistor 162. The varactor element 160 has the other terminal connected to the other input/output terminal of the alternating current signal and also connected to an output terminal of the control voltage.

In the circuit configuration illustrated in FIG. 27A, the signal current (alternating current signal) flows in the bias removal capacitor 161 and the varactor capacitor 160 and the control current (direct bias current) flows only in the varactor capacitor 160 via the current limiting resistor 162. At this point, by changing the control voltage, the capacitance of the varactor capacitor 160 is changed, and as a result, the signal current is also changed.

In an example illustrated in FIG. 27B, the varactor element 160 has one of the terminals, similar to FIG. 27A, connected to one of the input/output terminals of the alternating current signal via the bias removal capacitor 161 and also connected to an input terminal of the control voltage via the current limiting resistor 162. In the example illustrated in FIG. 27B, the varactor element 160 has the other terminal connected to the other input/output terminal of the alternating current signal via a bias removal capacitor 163 and also connected to an output terminal of the control voltage via a current limiting resistor 164. That is, in the example illustrated in FIG. 27B, the peripheral circuitry configuration connected to the formerly mentioned one terminal of the varactor element 160 is also applied to the other terminal.

In the circuit configuration illustrated in FIG. 27B, similar to the example illustrated in FIG. 27A, the signal current flows in the two bias removal capacitors 161 and 163 and also the varactor capacitor 160, and the control current flows only in the varactor capacitor 160. Therefore, in the example illustrated in FIG. 27B as well, the capacitance of the varactor capacitor 160 is also changed by changing the control voltage, and as a result, the signal current is also changed.

However in the circuit configuration illustrated in FIGS. 27A and 27B, while the control voltage source and the signal voltage source are configured individually, the terminal of the varactor element 160 to which they are finally connected is in common. In this case, although the two terminals are arranged to function as four terminals in the circuit, the direct bias current (control current) flowing from the control voltage source interferes with the signal current (refer to arrows in broken lines in FIG. 27B, for example).

Therefore, the circuit configuration illustrated in FIGS. 27A and 27B uses the current limiting resistor 162 and/or 164 for protection and/or separation of the control circuit, and uses the bias removal capacitor 161 and/or 163 for protection and/or separation of the signal circuit. The resistance value R is in particular established to be large for secure protection and/or separation of the control circuit. However, in this case, a time constant (=RC) determined by the resistance value R of the current limiting resistor 162 and/or 164 and the capacitance C of the varactor element 160 becomes large and the responsiveness of capacitance control is decreased.

Although the varactor elements illustrated in FIGS. 27A and 27B are provided with the bias removal capacitor(s) as they are substantially two-terminal elements, the present inventors already proposed a varactor element of a configuration without using such a bias removal capacitor (refer to Japanese Unexamined Patent Application Publication No. 2007-287996). In Japanese Unexamined Patent Application Publication No. 2007-287996, an element is proposed that uses a ferroelectric material as a varactor element. FIGS. 28A and 28B illustrate the electrode structure of a varactor element 200 proposed in Japanese Unexamined Patent Application Publication No. 2007-287996. FIG. 28A is a schematic perspective view of the varactor element 200, and FIG. 28B is a cross-sectional configuration diagram of a dielectric member 204 configuring the varactor element 200.

In the varactor element 200 according to Japanese Unexamined Patent Application Publication No. 2007-287996, respective terminals are provided on four faces of the dielectric member 204 in a rectangular parallelepiped shape. Out of the four terminals, two of the facing terminals are signal terminals 203a and 203b connected to a signal power source 203 and the other two facing terminals are control terminals 202a and 202b connected to a control power source 202.

Inside the varactor element 200, as illustrated in FIG. 28B, has a structure in which a plurality of control electrodes 202c through 202g and a plurality of signal electrodes 203c through 203f are alternately laminated via a ferroelectric layer 205. In the example of FIG. 28B, the control electrode 202g of the lowermost layer, the fifth control electrode 202e from the bottom, and the control electrodes 202c of the uppermost layer in the drawing are connected to one of the control terminals, 202a. The third control electrode 202f from the bottom and the seventh control electrode 202d from the bottom are connected to the other control terminal 202b. The fourth signal electrode 203e from the bottom and the eighth signal electrode 203c from the bottom are connected to one of the signal terminals, 203a. The second signal electrode 203f from the bottom and the sixth signal electrode 203d from the bottom are connected to the other signal terminal 203b.

The varactor element 200 according to Japanese Unexamined Patent Application Publication No. 2007-287996 has a configuration of separately providing the control terminals and the signal terminals to separately apply the control voltage or the signal voltage to the respective terminals. The varactor element 200 according to Japanese Unexamined Patent Application Publication No. 2007-287996 also has a configuration in which the plurality of signal electrodes and control electrodes are laminated inside the dielectric member 204. Therefore, the varactor element 200 of Japanese Unexamined Patent Application Publication No. 2007-287996 has an advantage of allowing the capacitance to be increased at low costs. Further, the varactor element 200 of a structure such as in Japanese Unexamined Patent Application Publication No. 2007-287996 is manufactured easily at low costs. The varactor element 200 according to Japanese Unexamined Patent Application Publication No. 2007-287996 also has an advantage of working without a bias removal capacitor.

SUMMARY

As described above, since the signal electrodes and the control electrodes are alternately laminated via the ferroelectric layer 205 in the varactor element 200 of Japanese Unexamined Patent Application Publication No. 2007-287996, adjacent electrodes are capacitively coupled to each other as illustrated by capacitors C1 through C8 in FIG. 28B. As a result, a signal capacitor formed between the pair of signal terminals 203a and 203b and a controlling capacitor formed between the pair of control terminals 202a and 202b turn out to be directly connected to each other in the dielectric member 204. At this time, the direction of a signal field generated between the pair of signal terminals 203a and 203b becomes same as the direction of a control field generated between the pair of control terminals 202a and 202b. FIG. 29 illustrates such a behavioral situation in the dielectric member 204 more schematically.

Although the directions of the pair of signal terminals 203a and 203b facing each other are perpendicular to the directions of the pair of control terminals 202a and 202b facing each other in the varactor element 200 of Japanese Unexamined Patent Application Publication No. 2007-287996, the signal electrodes and the control electrodes are alternately laminated via the ferroelectric layer 205 inside the dielectric member 204. Therefore, the varactor element 200 has a configuration substantially equivalent to a configuration in which the pair of signal terminals 203a and 203b and the pair of control terminals 202a and 202b are disposed in an identical direction as illustrated in FIG. 29. The varactor element 200 also has a configuration in which the pair of control terminals 202a and 202b is connected with a variable capacitor and the signal terminals and the control terminals are connected with fixed (constant capacitance) capacitors. In this case, the direction of a signal field generated between the pair of signal terminals 203a and 203b becomes same as the direction of a control field generated between the pair of control terminals 202a and 202b (direction of an arrow in a broken line in FIG. 29).

In the varactor element 200 of the configuration described above in which the direction of the signal field conforms to the direction of the control field, in order to change the capacitance value with a lower control voltage, the sensitivity of the control field (intensity of the control field) is desirably enhanced by making the ferroelectric layer 205 thinner. However, making the ferroelectric layer 205 thinner causes a problem that the insulating properties are decreased and the withstanding voltage relative to the signal voltage becomes lower.

That is, in the varactor element 200 having such an electrode configuration as proposed in Japanese Unexamined Patent Application Publication No. 2007-287996, to make the control voltage lower is incompatible to make the withstanding voltage relative to the signal voltage higher. Accordingly, it is difficult for the varactor element 200 having such an electrode configuration as proposed in Japanese Unexamined Patent Application Publication No. 2007-287996 to sufficiently support such an application in which a signal voltage with large amplitude is inputted and the capacitance value of the varactor element 200 is desired to be controlled with a lower control voltage. In a case that the intensity of the signal field is large, there is also a problem of varying the permittivity depending on the level of a signal producing the signal field (alternating current signal) and thus changing the capacitance of the varactor element.

It is desirable to provide a varactor element that can establish the sensitivity of a control field between the control terminals regardless of the withstanding voltage performance relative to the signal voltage and maintains capacitance unchanged by the level of a signal inputted between the signal terminals and to provide an electronic device provided with the same.

According to an embodiment, there is provided a first varactor element provided with a dielectric layer; a pair of signal electrodes, each disposed on one face of the dielectric layer and facing each other; and a pair of control electrodes, each disposed on another face of the dielectric layer. In the embodiment, the pair of control electrodes is disposed facing each other parallel to a direction intersecting a direction of the pair of signal electrodes facing each other.

According to another embodiment, there is provided a second varactor element provided with a pair of signal electrodes disposed facing each other parallel to a predetermined direction and a pair of control electrodes disposed facing each other parallel to a direction intersecting the predetermined direction. In addition, the second varactor element according to the embodiment is provided with a first dielectric layer disposed between the pair of signal electrodes and disposed between the pair of control electrodes and a second dielectric layer having a permittivity lower than that of the first dielectric layer and disposed between the signal electrodes and the control electrodes.

As described above, in the first and second varactor elements according to the embodiments, a pair of signal electrodes and a pair of control electrodes are provided separately and a capacitance value of a signal capacitor between the pair of signal electrodes is changed by a control field generated between the pair of control electrodes. In addition, in the embodiments, each electrode is disposed in such a manner that directions of the pair of signal electrodes facing each other intersect directions of the pair of control electrodes facing each other. Therefore, in the embodiments, it is possible to establish a relative permittivity, an electrode area, and an electrode distance, which are three elements determining the capacitance, separately for the signal electrodes and the control electrodes. That is, in the embodiments, it is possible to separately design the withstanding voltage performance between the signal terminals and the withstanding voltage performance between the control terminals.

According to still another embodiment, there is provided a first electronic device provided with the first varactor element according to the above embodiment and a control voltage supply unit supplying a control voltage to the pair of control electrodes.

According to yet another embodiment, there is provided a second electronic device provided with the second varactor element according to the above embodiment and a control voltage supply unit supplying a control voltage to the pair of control electrodes.

In the varactor elements according to the embodiments, as described above, it is possible to separately (independently) design the withstanding voltage performance between the signal terminals and the withstanding voltage performance between the control terminals. Therefore, according to the embodiments, it is possible to provide a varactor element that can establish the sensitivity of a control field between the control terminals regardless of the withstanding voltage performance relative to the signal voltage and maintains the capacitance unchanged by the level of a signal inputted between the signal terminals.

In addition, since the electronic devices according to the embodiments are provided with the varactor elements according to the embodiments described above, it is possible to control the capacitance of the varactor element with a lower control voltage even in an electronic device to which a high signal voltage is inputted.

Additional features and advantages are described herein, and will be apparent from the following Detailed Description and the figures.

DETAILED DESCRIPTION

Figure 1:
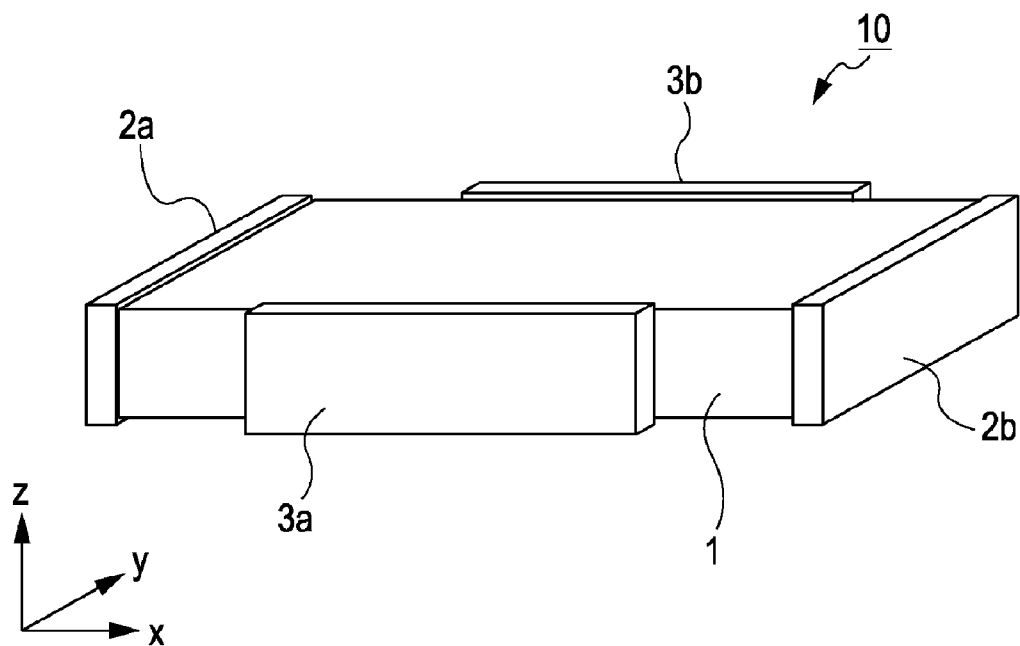
FIG. 1 is a schematic configuration diagram of a varactor element according to an embodiment.

A description is given below to examples of varactor elements according to embodiments and an electronic device provided with the same referring to the drawings in the following order. Embodiments are not limited to the examples below.

1. Embodiment: a basic configuration example of a varactor element according to an embodiment 2. Another Embodiment: a configuration example of a varactor element provided with low dielectric layers 3. Still Another Embodiment: a configuration example of an electronic device provided with a varactor element according to embodiments 1. Embodiment Configuration of Varactor Element FIG. 1 illustrates a schematic configuration of a varactor element according to an embodiment. In FIG. 1, the direction from left to right of the drawing is defined as an x direction, the direction from bottom to top of the drawing as a z direction, and the direction from front to back of the drawing as a y direction.

A varactor element 10 is provided with a dielectric member 1 in, for example, a rectangular parallelepiped shape, a pair of signal terminals 2a and 2b (first and second signal terminals), and a pair of control terminals 3a and 3b (first and second control terminals).

Both of the first and second signal terminals 2a and 2b can be formed of a metal member having the shape of, for example, a flat plate. The first and second signal terminals 2a and 2b are provided respectively on two facing side faces of the dielectric member 1. In the example illustrated in FIG. 1, the first and second signal terminals 2a and 2b are provided respectively on the two side faces that are perpendicular to the x direction. The first and second signal terminals 2a and 2b are connected respectively to first and second signal electrodes 12a and 12b, described later, formed in the dielectric member 1.

Both of the first and second control terminals 3a and 3b can be formed of a metal member having the shape of, for example, a flat plate. The first and second control terminals 3a and 3b are provided respectively on two facing side faces of the dielectric member 1 on which the first and second signal terminals 2a and 2b are not provided. In the example illustrated in FIG. 1, the first and second control terminals 3a and 3b are provided respectively on the two side faces that are perpendicular to the y direction. The first and second control terminals 3a and 3b are connected respectively to first and second control electrodes 13a and 13b, described later, formed in the dielectric member 1. In addition, the signal terminals and the control terminals are formed on the side faces of the dielectric member 1 so as not to make contact with each other.

Figure 2:
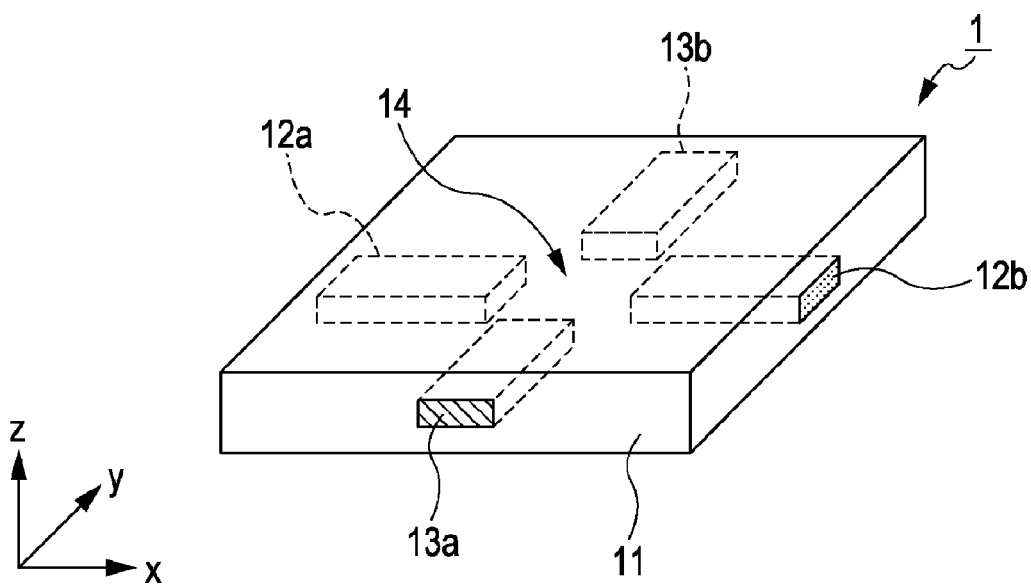
FIG. 2 is a perspective view of a dielectric member according to the embodiment.
Figure 3A:
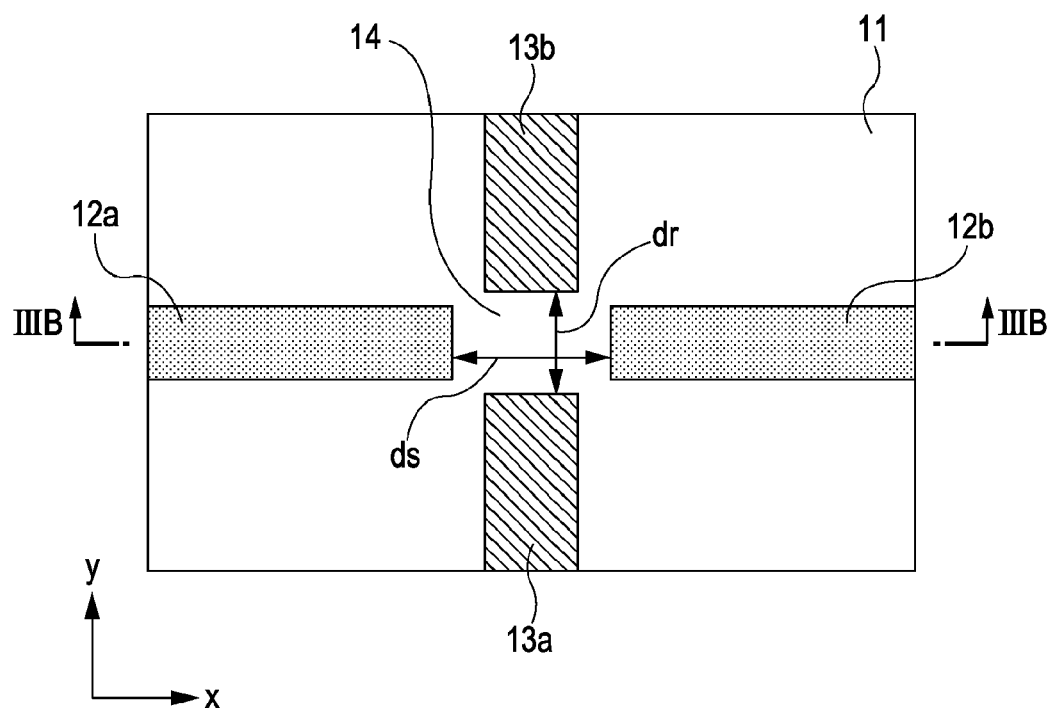
FIG. 3A is a transparent view of the dielectric member according to the embodiment taken from an upper face thereof.
Figure 3B:
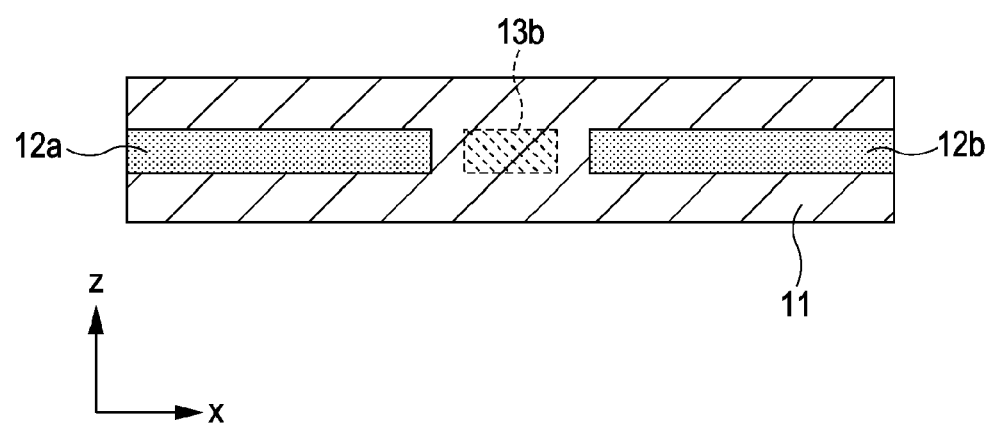
FIG. 3B is a cross-sectional view taken from IIIB-IIIB in FIG. 3A.

FIGS. 2, 3A, and 3B illustrate a configuration example of the dielectric member according to this embodiment. FIG. 2 is an external perspective view of the dielectric member 1. FIG. 3A is a transparent view taken from the upper face of the dielectric member 1, and FIG. 3B is a cross-sectional view taken from the IIIB-IIIB in FIG. 3A.

The dielectric member 1 is configured mainly with a dielectric member main body 11, and a pair of signal electrodes 12a and 12b (first and second signal electrodes) and a pair of control electrodes 13a and 13b (first and second control electrodes) formed therein.

The dielectric member main body 11 is formed of a dielectric material having a permittivity varied by an application of the control voltage. For example, the dielectric member main body 11 is formed of a ferroelectric material with such a relative permittivity of more than 1000.

Specifically, it is possible to use a ferroelectric material that produces ionic polarization for the material to form the dielectric member main body 11. The ferroelectric material producing ionic polarization is a ferroelectric material that is formed of an ionic crystalline material and electrically polarizes due to displacement of positive and negative ion atoms. Such a ferroelectric material producing ionic polarization is generally represented by a chemical formula, $ABO_3$ (O denotes an oxygen element), where A and B denote predetermined two elements, and has a perovskite structure. Such a ferroelectric material may include, for example, barium titanate ($BaTiO_3$), potassium niobate ($KNbO_3$), and lead titanate ($PbTiO_3$). As a material to form the dielectric member main body 11, PZT (lead zirconate titanate), for example, may also be used in which lead titanate ($PbTiO_3$) is mixed with lead zirconate ($PbZrO_3$).

As a material to form the dielectric member main body 11, a ferroelectric material may also be used that produces electronic polarization. In such a ferroelectric material, an electric dipole moment is produced in which a portion biased by positive charge is divided from a portion biased by negative charge and thus the polarization is produced. As such a material, rare earth iron oxides has been reported in the past that form a surface of $Fe^{2+}$ charge and surface of $Fe^{3+}$ charge to form the polarization and show ferroelectric properties. In this system, materials represented by a molecular formula, $(RE).(TM)_2.O_4$ (O: oxygen element), where RE denotes a rare earth element and TM denotes an iron group element are reported to have a high permittivity. Such a rare earth element may include, for example, Y, Er, Yb, and Lu (in particular, Y and heavy rare earth element), and such an iron group element may include, for example, Fe, Co, and Ni (in particular, Fe). Such $(RE).(TM)_2.O_4$ may include, for example, $ErFe_2O_4$, $LuFe_2O_4$, and $YFe_2O_4$.

As a material to form the dielectric member main body 11, a ferroelectric material having anisotropy may also be used. The dielectric member main body 11 is formed by integrating a plurality of dielectric sheets described later by sintering or the like.

The first and second signal electrodes 12a and 12b are electrodes to which the alternating current signal is applied from the outside via the first and second signal terminals 2a and 2b, and are disposed to face each other separated at a predetermined interval. In the example illustrated in FIGS. 2 and 3, both of the first and second signal electrodes 12a and 12b are configured with electrodes having an upper face in the shape of, for example, a rectangular, and both signal electrodes are disposed in such a manner that both signal electrodes have each end on a transverse side facing each other separated at a predetermined interval. In the example illustrated in FIGS. 2 and 3, the first and second signal electrodes 12a and 12b are disposed in such a manner that they face parallel to the x direction.

The first and second control electrodes 13a and 13b are electrodes to which the controlling voltage is applied via the first and second control terminals 3a and 3b, and are disposed to face each other separated at a predetermined interval. At this point, the first and second control electrodes 13a and 13b are disposed in such a manner that the directions of the first and second control electrodes 13a and 13b facing each other intersect the directions of the first and second signal electrodes 12a and 12b.

In the example illustrated in FIGS. 2 and 3, both first and second control electrodes 13a and 13b are configured with electrodes having an upper face in the shape of, for example, a rectangular, and both control electrodes are disposed in such a manner that both control electrodes have each end on a transverse side facing each other separated at a predetermined interval. In the example illustrated in FIGS. 2 and 3, the first and second control electrodes 13a and 13b are disposed in such a manner that the directions of the first and second control electrodes 13a and 13b facing each other are perpendicular to the directions of the first and second signal electrodes 12a and 12b facing each other (x direction), that is, become parallel to the y direction.

In addition, the first and second signal electrodes 12a and 12b and the first and second control electrodes 13a and 13b are formed in a thickness comparable to each other and are formed on an approximately identical plane in the in-plane direction of the dielectric member 1.

This embodiment is assumed to provide the varactor element 10 suitable for an application to desirably have a large external signal inputted thereto and change the capacitance at a low control voltage. Therefore, a distance ds between the facing first and second signal electrodes 12a and 12b (electrode distance) is preferably established to be larger than a distance dr between the facing first and second control electrodes 13a and 13b as illustrated in FIG. 3A. This is because of the following reason.

Since an input signal is large in such an application as described above, from the perspective of the resistance properties in the varactor element 10, the distance between the signal electrodes is preferably extended as much as possible to make the intensity of the signal field in the element smaller. In addition, from the perspective of low voltage driving, the distance between the control electrodes is preferably established as small as possible to enhance the intensity of the control field. Therefore, in such an application as described above, the distance ds between the signal electrodes are usually larger than the distance dr between the control electrodes as illustrated in FIG. 3A. However, the relative magnitudes of the distance ds between the signal electrodes and the distance dr between the control electrodes are not limited to that but can be appropriately modified in correspondence with applications. That is, depending on applications to apply the varactor element 10, there are also cases that the distance ds between the signal electrodes is same as the distance dr between the control electrodes or the distance ds between the signal electrodes is smaller than the distance dr between the control electrodes.

The first and second signal electrodes 12a and 12b and the first and second control electrodes 13a and 13b are formed using a conductive paste including, for example, metal fine powder (Pd, Pd/Ag (alloy of Pd and Ag), Ni, or the like). This enables to reduce the costs of manufacturing the varactor element 10.

By disposing and configuring each of the electrodes as described above, it becomes possible to intersect the direction of the signal field generated between the first and second signal electrodes 12a and 12b with the direction of the control field generated between the first and second control electrodes 13a and 13b in an identical plane in the dielectric member 1.

As the signal field and the control field intersect with each other in the in-plane direction of the dielectric member 1 in the varactor element 10 according to this embodiment as described above, it is referred to below as a varactor element 10 intersecting in plane. In this embodiment, a dielectric region 14 of the dielectric member main body 11 sandwiched between the first and second signal electrodes 12a and 12b and the first and second control electrodes 13a and 13b becomes a main region having variable capacitance. Therefore, the dielectric region 14 is referred to below as a variable capacitance region (first dielectric layer).

Although a description is given above to the configuration example in which the directions of the signal electrodes facing each other is perpendicular to the directions of the control electrodes facing each other in this embodiment, embodiments are not limited to this. The directions of the signal electrodes facing each other and the directions of the control electrodes facing each other may not be perpendicular to but may also intersect with each other. In this embodiment, a description is given above with FIGS. 2 and 3 to the example in which the pair of signal electrodes are provided so as to face each other parallel to the longitudinal sides (x direction in the drawings) of the dielectric member main body 11 and the pair of control electrodes are provided so as to face each other parallel to the transverse sides (y direction in the drawings) of the dielectric member main body 11. However, embodiments are not limited to this. In FIGS. 2 and 3, the pair of signal electrodes may also face each other in the y direction and the pair of control electrodes in the x direction. Although a description is given above to the example of the dielectric member 1 in, for example, a rectangular parallelepiped shape in this embodiment, the shape of the dielectric member 1 can be arranged in any shape in correspondence with applications and the like.

Method of Fabricating Varactor Element

Figure 4:
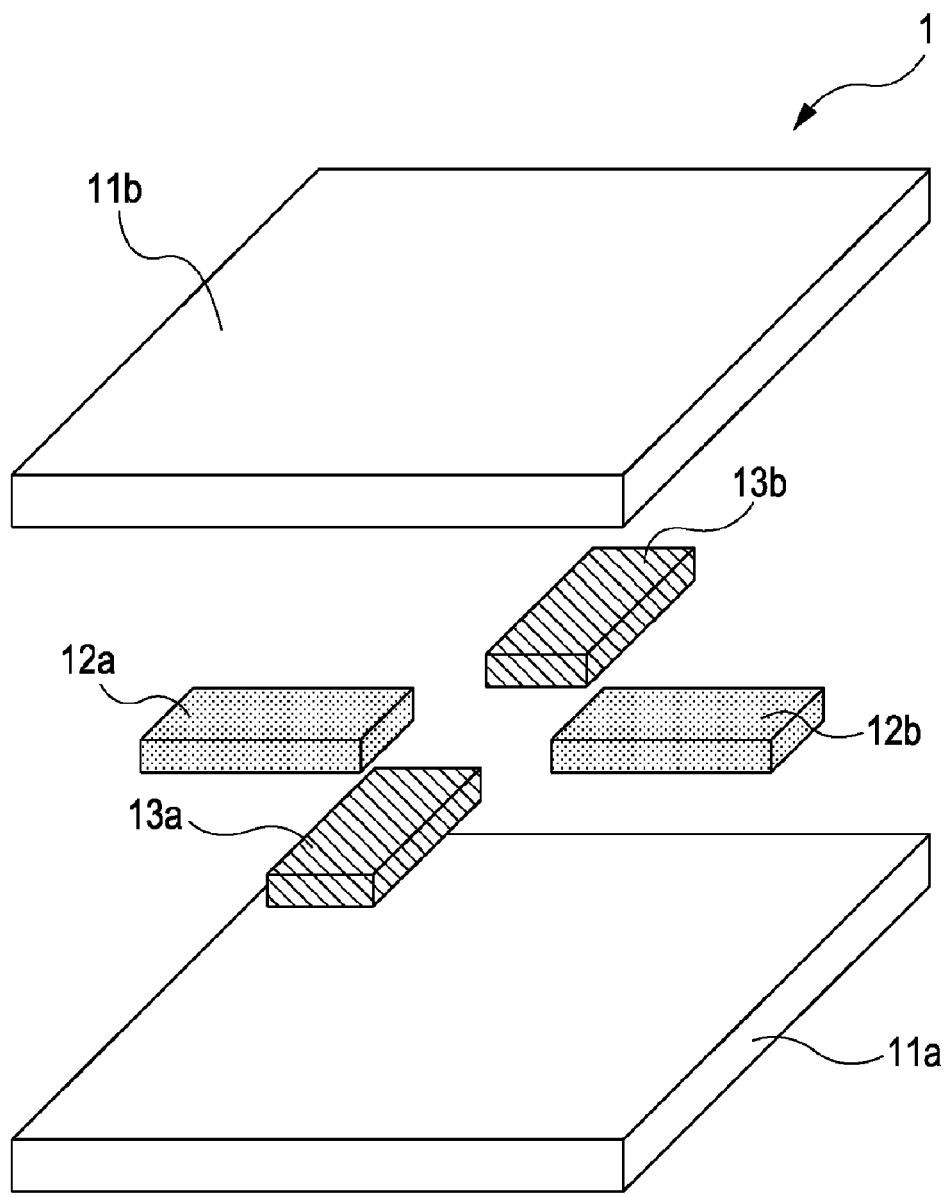
FIG. 4 is an exploded perspective view of the dielectric member according to the embodiment.

Next, a brief description is given to an example of a method of fabricating the varactor element 10 according to this embodiment referring to FIG. 4. FIG. 4 is an exploded perspective view of the dielectric member 1 according to this embodiment.

Firstly, a dielectric sheet 11a (dielectric layer) formed of the ferroelectric material described above is prepared. In addition, a mask is prepared in which openings are formed in regions corresponding to regions to form the first and second signal electrodes 12a and 12b and the first and second control electrodes 13a and 13b.

Subsequently, a conductive paste is prepared by making metal fine powder of, for example, Pd, Pd/Ag, Ni, or the like into a paste, and the conductive paste is applied (silk screen printing or the like) on the dielectric sheet 11a via the mask. In this way, the first and second signal electrodes 12a and 12b and the first and second control electrodes 13a and 13b are formed on one of the surfaces of the dielectric sheet 11a.

Subsequently, another dielectric sheet 11b formed of the ferroelectric material described above is laminated on the surface of the dielectric sheet 11a on which the electrodes are formed for thermocompression. Then, the thermocompressed members are sintered in a reducing atmosphere at a high temperature to integrate the two dielectric sheets 11a and 11b and the conductive paste layer (signal electrodes and control electrodes). In this embodiment, the varactor element 10 intersecting in plane is fabricated in such a manner.

Behavior of Varactor Element

Figure 5:
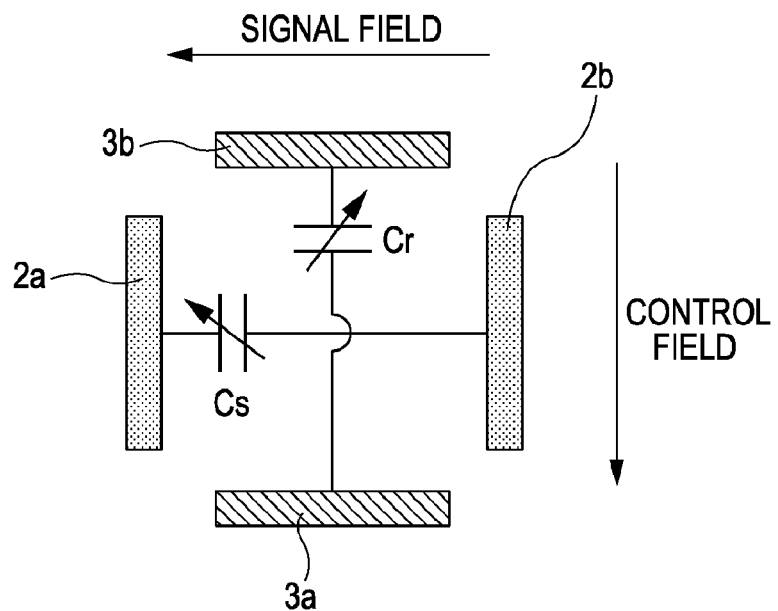
FIG. 5 illustrates a behavioral outline of the varactor element according to the embodiment.

FIG. 5 is a schematic view illustrating a behavioral outline of the varactor element 10 according to this embodiment. As described above, in the varactor element 10 according to this embodiment, the direction of the signal field generated between the first and second signal terminals 2a and 2b is perpendicular to the direction of the control field generated between the first and second control terminals 3a and 3b. Therefore, the varactor element 10 according to this embodiment has a configuration equivalent to a configuration in which each terminal is disposed in such a manner that the directions of the pair of signal terminals 2a and 2b facing each other is perpendicular to the directions of the pair of control terminals 3a and 3b facing each other and a separate varactor capacitor is connected between the signal terminals and between the control terminals respectively.

In the varactor element 10 according to this embodiment, since the dielectric member 1 is formed of the ferroelectric material described above, the state of polarization in the variable capacitance region 14 is changed by applying a direct current control voltage between the first and second control terminals 3a and 3b and thus the permittivity (relative permittivity) is varied. As a result, the capacitance value Cr of the controlling capacitor between the first and second control terminals 3a and 3b. At this point, with the variation of the permittivity in the variable capacitance region 14, the capacitance value Cs between the first and second signal terminals 2a and 2b is also changed. That is, in the varactor element 10 according to this embodiment, the capacitance value Cs between the first and second signal terminals 2a and 2b can be controlled by the control voltage applied between the first and second control terminals 3a and 3b. Therefore, in this embodiment, the varactor element 10 can be acted as a capacitive element having a controlled signal capacitor in a case that the alternating current signal is inputted between the signal terminals.

As described above, in the varactor element 10 according to this embodiment, the pair of signal electrodes 12a and 12b (terminals) and the pair of control electrodes 13a and 13b (terminals) are provided separately. In this embodiment, each of the electrodes is disposed in such a manner that the directions of the pair of signal electrodes 12a and 12b facing each other and the directions of the pair of control electrodes 13a and 13b facing each other become perpendicular to each other. Then, the capacitance value of the signal capacitor between the pair of signal electrodes 12a and 12b is controlled by the control field generated between the pair of control electrodes 13a and 13b. Therefore, in this embodiment, the relative permittivity, the electrode area, and electrode distance, which are the three elements determining the capacitance, can be separately established for the signal electrodes and the control electrodes respectively. That is, according to this embodiment, the withstanding voltage performance between the signal terminals 2a and 2b and the withstanding voltage performance between the control terminals 3a and 3b can be separately designed, and thus the sensitivity of the control field between the control terminals 3a and 3b can be established regardless of the withstanding voltage relative to the signal voltage. In addition, according to this embodiment, it is possible to provide a varactor element that maintains the capacitance unchanged by the level of the signal inputted between the signal terminals.

Figure 6:
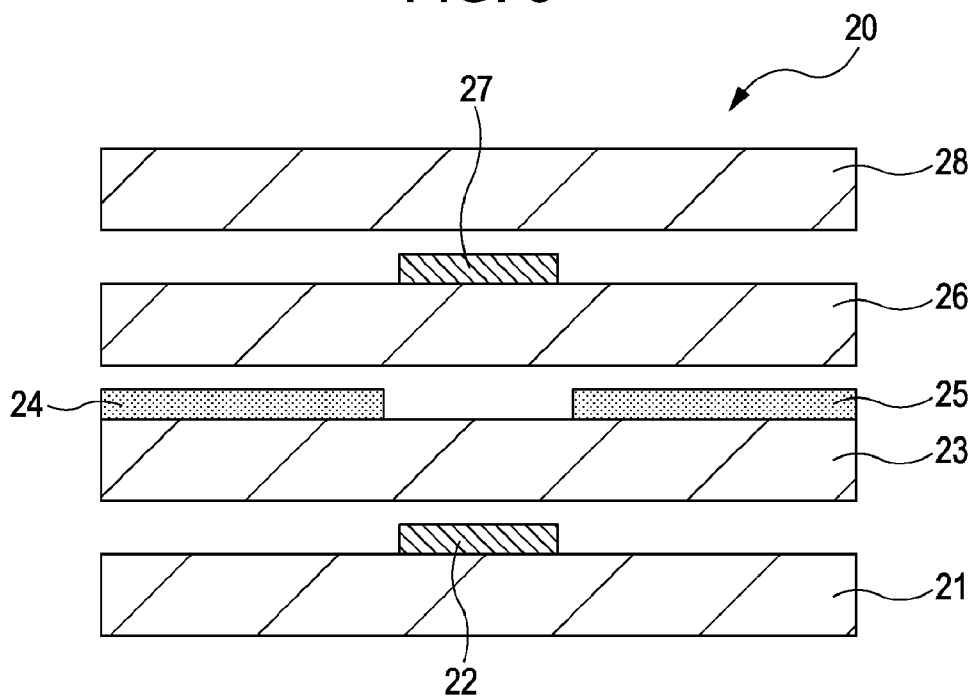
FIG. 6 is an exploded side view of a dielectric member of a varactor element intersecting parallel to the thickness.

As a varactor element having a configuration of intersecting the signal field and the control field other than this embodiment, a configuration, for example, in which a signal field is generated in an in-plane direction of a dielectric member and a control field is generated parallel to the thickness of the dielectric member is also considered. FIG. 6 illustrates a configuration of such a varactor element. FIG. 6 is an exploded side view of a dielectric member of such a varactor element.

A dielectric member 20 of a varactor element illustrated in FIG. 6 is provided with a first dielectric sheet 21 having a first control electrode 22 formed on the surface, a second dielectric sheet 23 having a pair of signal electrodes 24 and 25 formed on the surface, and a third dielectric sheet 26 having a second control electrode 27 formed on the surface. The dielectric member 20 is further provided with a fourth dielectric sheet 28 that covers the second control electrode 27 formed on the third dielectric sheet 26. Each dielectric sheet can be formed of a ferroelectric material similar to the material to form the dielectric member described in the above embodiment. Each electrode can also be formed of a material similar to the material to form the signal electrodes and the control electrodes according to this embodiment described above.

Figure 7A:
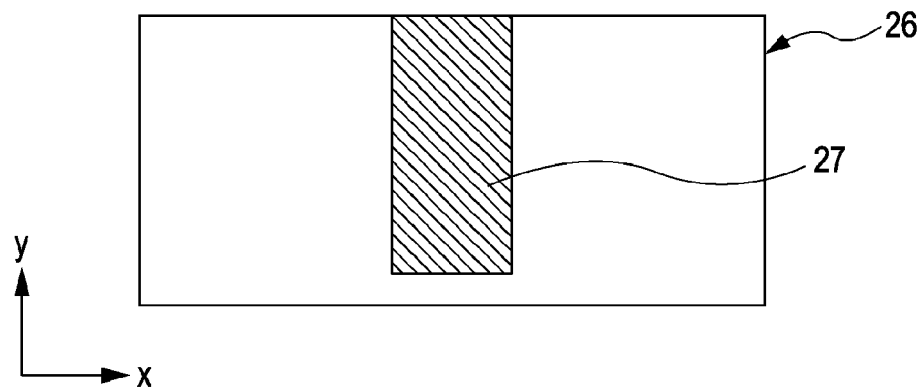
FIGS. 7A through 7C are top views of individual layers configuring the dielectric member of the varactor element intersecting parallel to the thickness.
Figure 7B:
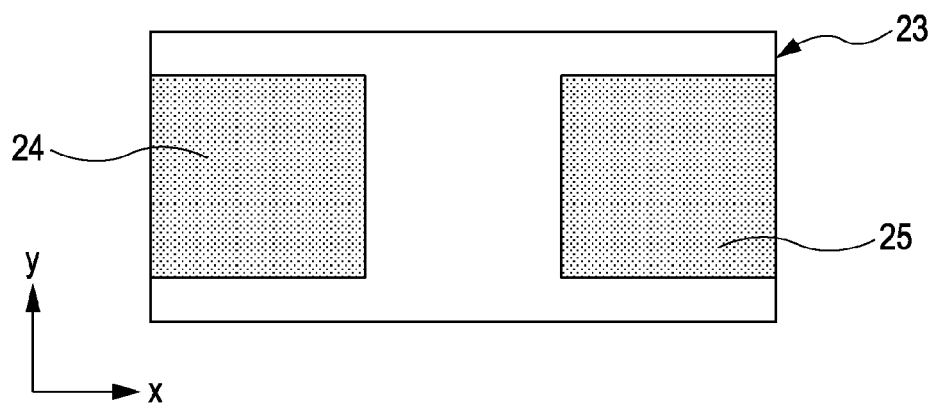
Figure 7C:
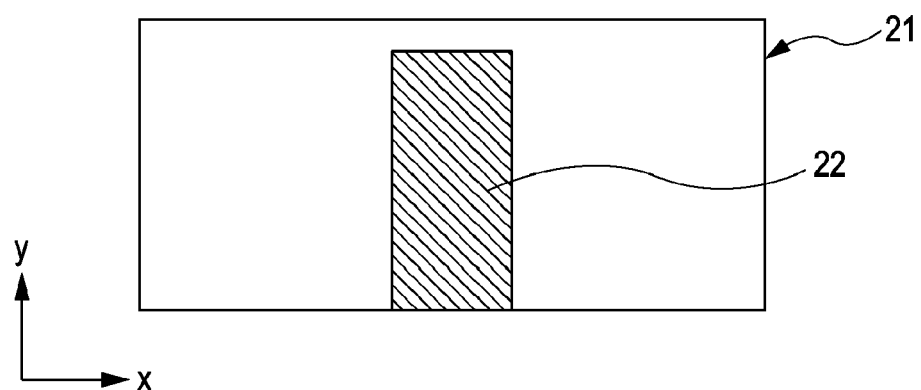

FIGS. 7A through 7C illustrate a configuration of the electrodes formed on each of the dielectric sheets. FIG. 7A is a top view of the third dielectric sheet 26, FIG. 7B is a top view of the second dielectric sheet 23, and FIG. 7C is a top view of the first dielectric sheet 21.

On the third dielectric sheet 26, as illustrated in FIG. 7A, the second control electrode 27 is formed that extends along a direction from the center at an end on one of the longitudinal sides parallel to the transverse sides (y direction in FIG. 7A) and has an upper face in, for example, a rectangular shape.

On the second dielectric sheet 23, as illustrated in FIG. 7B, a pair of signal electrodes 24 and 25 having an upper face in, for example, a rectangular shape is formed in the vicinity of both ends on the transverse sides separated at a predetermined interval. The distance between the pair of signal electrodes 24 and 25 is established at a value equal to or more than the width of the second control electrode 27 (or the first control electrode 22). In the example of FIG. 7B, the configuration (shape, dimensions, and the like) of the pair of signal electrodes 24 and 25 is same.

On the first dielectric sheet 21, as illustrated in FIG. 7C, the first control electrode 22 is formed that extends along a direction from the center at an end on the other of the longitudinal sides parallel to the transverse sides (y direction in FIG. 7C) and has an upper face in, for example, a rectangular shape. In the example of FIGS. 7A and 7C, the first and second control electrodes 22 and 27 have a same configuration.

Figure 8:
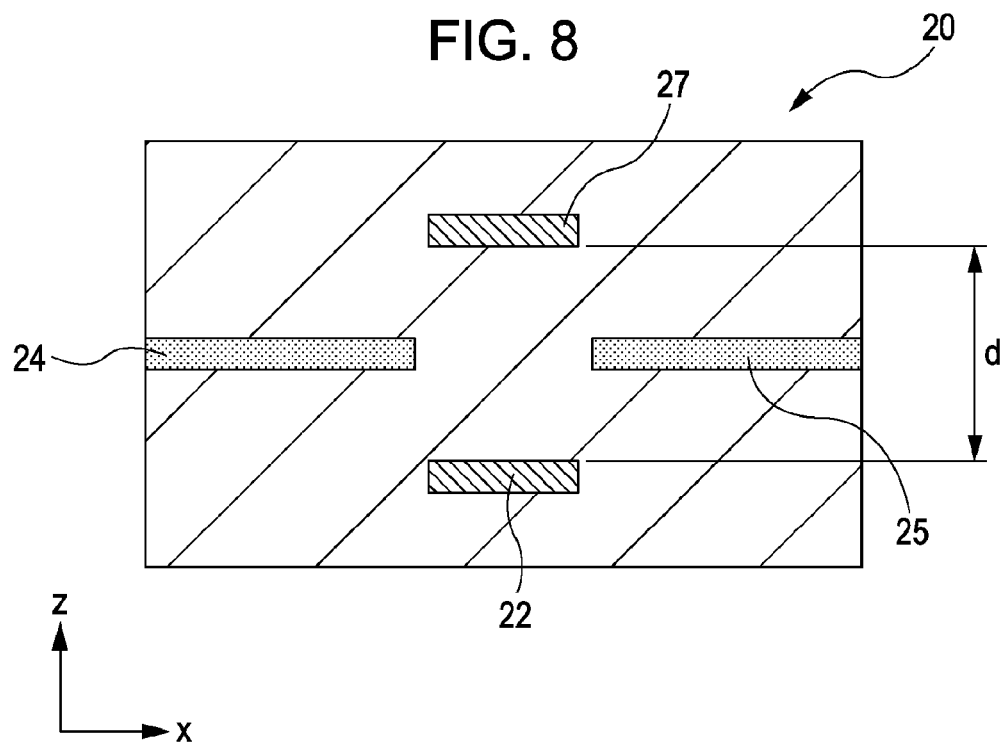
FIG. 8 is a schematic cross-sectional view of the dielectric member of the varactor element intersecting parallel to the thickness.

FIG. 8 illustrates a schematic cross-sectional view of the dielectric member 20 after integrating each of the dielectric sheets. As the electrodes of such a configuration as described above are formed on the respective dielectric sheets and the sheets are laminated in the order illustrated in FIG. 6 for integration, the first and second control electrodes 22 and 27 are disposed facing each other parallel to the thickness of the dielectric member 20. In contrast, the pair of signal electrodes 24 and 25 is disposed facing each other on an identical plane in the in-plane direction of the dielectric member 20.

In the varactor element illustrated in FIGS. 6 through 8, since the signal field is directed to the in-plane direction of the dielectric member 20 and the control field is directed parallel to the thickness, it is possible to intersect the signal field with the control field. Therefore, in a varactor element with such a configuration, the withstanding voltage performance between the signal terminals and the withstanding voltage performance between the control terminals can also be designed separately and the sensitivity of the control field between the control terminals can also be established regardless of the withstanding voltage performance relative to the signal voltage. A varactor element having such a mode of field intersection as the example illustrated in FIGS. 6 through 8 is referred to below as a varactor element intersecting parallel to the thickness.

However, the varactor element intersecting parallel to the thickness described above has the following disadvantages. This type of varactor element has a high accuracy of printing when forming predetermined electrodes on each of the dielectric sheets. Compared to that, it has a low accuracy of alignment between the electrodes when laminating each of the dielectric sheets. Therefore, in a varactor element intersecting parallel to the thickness, it becomes difficult to make the electrodes larger in consideration of the misalignment between the electrodes when laminating each of the dielectric sheets. For example, in the example illustrated in FIGS. 6 through 8, it is difficult to make the width of the two control electrodes 22 and 27 sufficiently widely. That is, in a varactor element intersecting parallel to the thickness, the size of the electrodes is limited due to the misalignment between the electrodes when laminating each of the dielectric sheets and there is a possibility that it is difficult to make the variable amount of the capacitance sufficiently large.

In the varactor element intersecting parallel to the thickness, the thickness d between the pair of control electrodes 22 and 27 becomes a thickness of approximately two dielectric sheets (refer to FIG. 8). That is, in the varactor element intersecting parallel to the thickness, it is difficult to make the interval between the control electrodes sufficiently small because of the restriction due to the number of dielectric sheets in between and the thickness of each of the dielectric sheets. As a result, in the varactor element intersecting parallel to the thickness, there is a possibility that it becomes difficult to make the control voltage sufficiently small.

In contrast, in the varactor element 10 according to this embodiment, since the signal electrodes and the control electrodes are formed in an identical plane in the dielectric member 1, such disadvantages described above (misalignment during the lamination) can be eliminated.

A configuration of the varactor element intersecting parallel to the thickness may be a configuration having a region in which a pair of control electrodes overlaps taken from the upper face of the varactor element as in the example illustrated in FIGS. 6 through 8 and may also be a configuration in which a pair of control electrodes does not overlap. As the no overlap configuration, the following configuration, for example, is considered. The mode of disposition of a pair of control electrodes and a pair of signal electrodes taken from the upper face of the varactor element is made similar to that of this embodiment (FIGS. 3A and 3B) and also each of the control electrodes is formed respectively in a dielectric layer upper or lower than the dielectric layer in which the pair of signal electrodes is formed. In such a configuration, the direction of the control field produced between the pair of control electrodes is tilted relative to the thickness and in-plane directions of the varactor element. In this case, although the distance between the pair of control electrodes becomes larger than the distance in the example illustrated in FIGS. 6 through 8, the distances between the control electrodes and the signal electrodes also becomes larger compared to the example illustrated in FIGS. 6 through 8, so that the parasitic capacitance between the control electrodes and the signal electrodes can be made smaller compared to the example illustrated in FIGS. 6 to 8.

2. Another Embodiment

Figure 9:
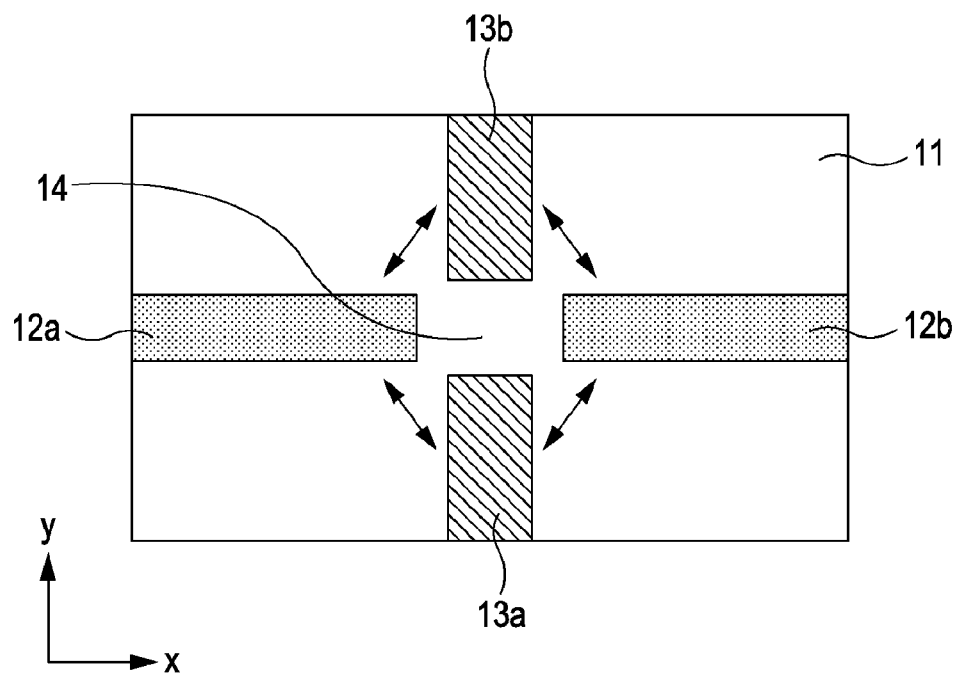
FIG. 9 illustrates a state of stray capacitance generated between electrodes of a varactor element intersecting in plane.

In the varactor element according to the above embodiment, a pair of signal electrodes and a pair of control electrodes are formed on an approximately identical plane in the in-plane direction in the dielectric member, and as the distance between the signal electrodes and the control electrodes becomes smaller, stray capacitance is generated between the signal electrodes and the control electrodes. Such a state is illustrated in FIG. 9. FIG. 9 is a transparent view of the dielectric member of the varactor element according to the previous embodiment taken the upper face.

In the varactor element according to the previous embodiment, when the distance between the signal electrodes and the control electrodes becomes smaller, stray capacitance (parasitic capacitance) is generated between the signal electrodes and the control electrodes in a region other than the variable capacitance region 14 as illustrated with the arrows in FIG. 9. More specifically, the stray capacitance is generated between ends on longitudinal sides of the signal electrodes and ends on longitudinal sides of the control electrodes closest to the ends of the signal electrodes. When the stray capacitance is generated between the signal electrodes and the control electrodes in such a manner, the range of variation in the capacitance of the varactor element becomes smaller.

With that, in this embodiment, a description is given to a varactor element in which the withstanding voltage performance between the signal terminals and the withstanding voltage performance between the control terminals can be designed separately and also the above problem of stray capacitance generated between the signal electrodes and the control electrodes can also be eliminated.

Configuration of Varactor Element

The entire configuration of a varactor element according to this embodiment is similar to the configuration of the previous embodiment (FIG. 1), though not shown, and the varactor element according to this embodiment is provided with a dielectric member in, for example, a rectangular parallelepiped shape, a pair of signal terminals, and a pair of control terminals. The disposition of each terminal is also similar to the previous embodiment. However, in this embodiment, only the configuration of the dielectric member is modified from that of the previous embodiment. Therefore, in this section, a description is given only to the configuration of the dielectric member.

Figure 10A:
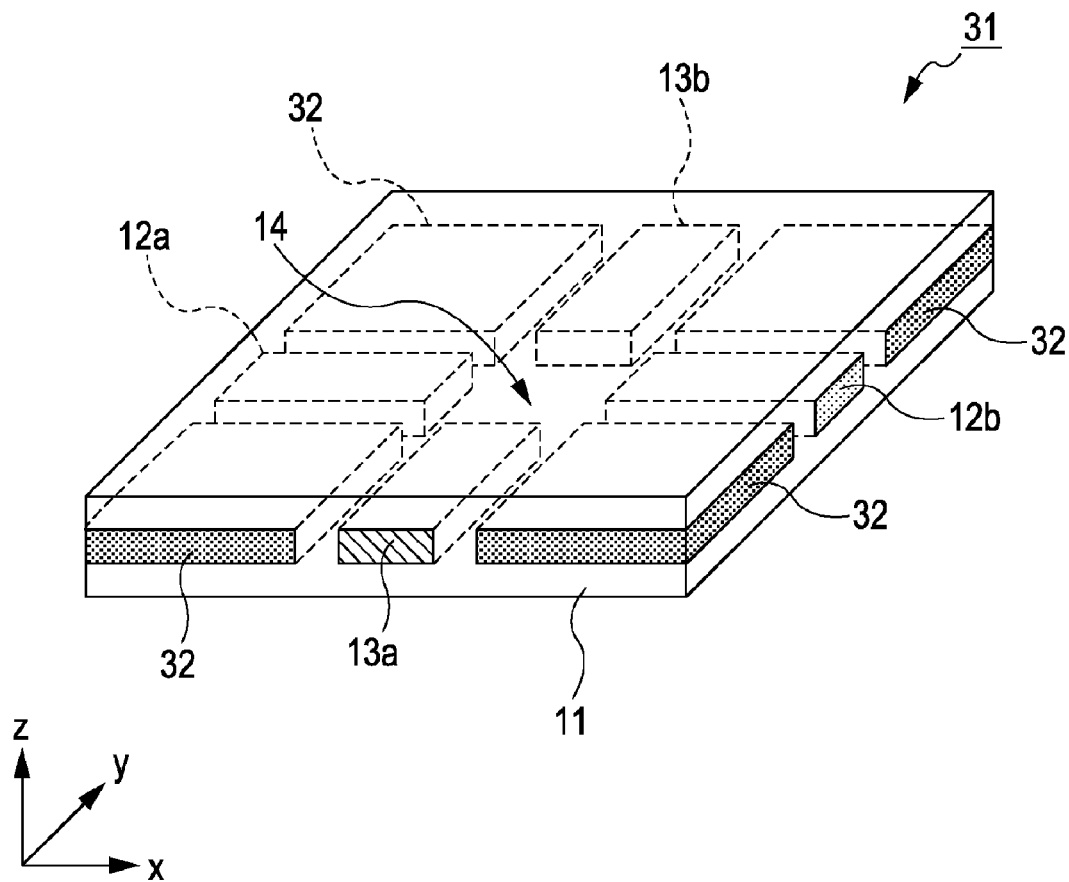
FIG. 10A is an external perspective view of a dielectric member of a varactor element according to another embodiment.
Figure 10B:
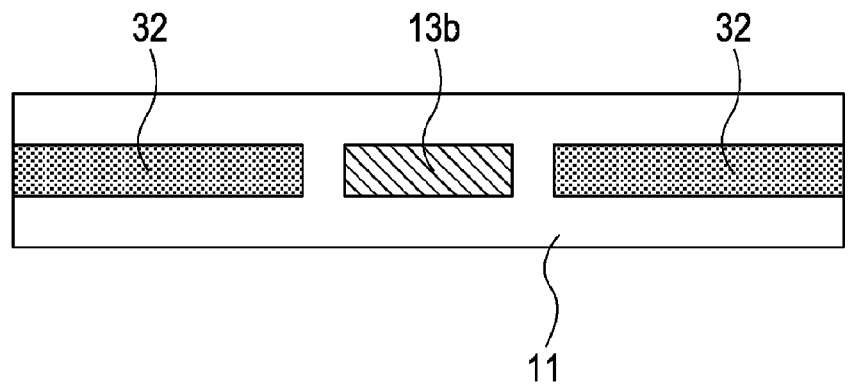
FIG. 10B is a side view thereof.

FIGS. 10A and 10B illustrate a configuration example of the dielectric member according to this embodiment. FIG. 10A an external perspective view of the dielectric member, and FIG. 10B is a side view of the dielectric member taken from the y direction in FIG. 10A. In FIGS. 10A and 10B, components similar to the previous embodiment (FIG. 2) are assigned to the same reference numerals and characters. In FIG. 10A, the direction from left to right of the drawing is defined as an x direction, the direction from bottom to top of the drawing as a z direction, and the direction from front to back of the drawing as a y direction.

A dielectric member 31 is configured with a dielectric member main body 11, and a pair of signal electrodes 12a and 12b (first and second signal electrodes), a pair of control electrodes 13a and 13b (first and second control electrodes), and four low dielectric layers 32 (second dielectric layers) formed therein.

The dielectric member main body 11 is formed of a ferroelectric material with such a relative permittivity of more than 1000, for example, similar to the previous embodiment. The first and second signal electrodes 12a and 12b and the first and second control electrodes 13a and 13b have a configuration similar to the previous embodiment and are disposed similarly.

Figure 11:
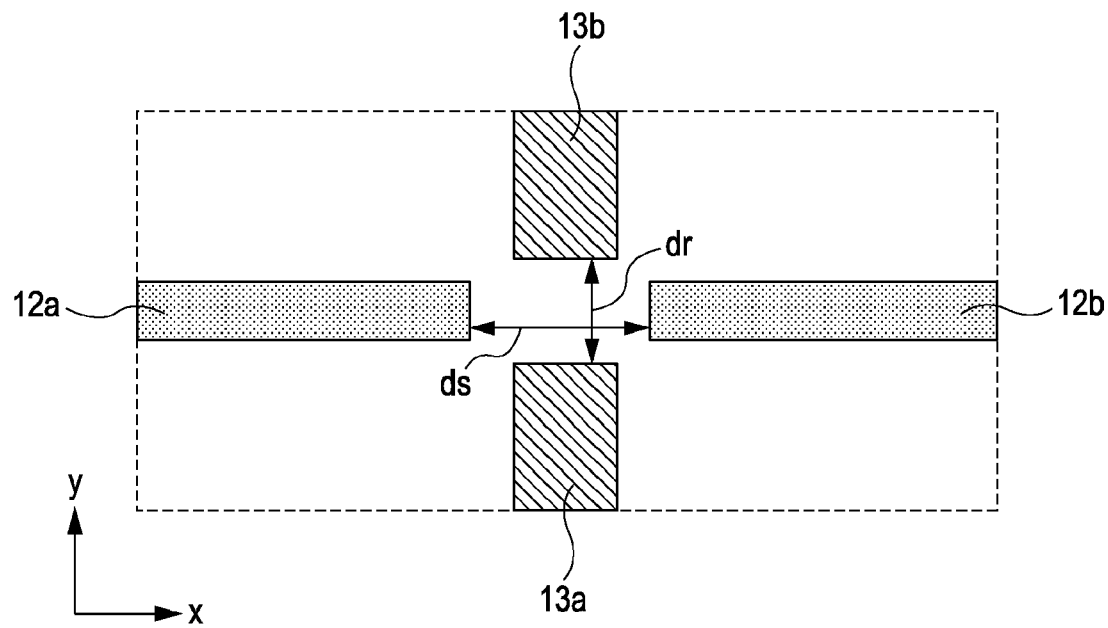
FIG. 11 is a layout drawing of signal electrodes and control electrodes in the varactor element according to the other embodiment.

FIG. 11 illustrates a layout drawing of the upper faces of the first and second signal electrodes 12a and 12b and the first and second control electrodes 13a and 13b. The first and second signal electrodes 12a and 12b are disposed along the x direction in the drawing separated by a predetermined distance, and the first and second control electrodes 13a and 13b are disposed along the y direction in the drawing separated by a predetermined distance. The first and second signal electrodes 12a and 12b and the first and second control electrodes 13a and 13b are disposed on an approximately identical plane in the in-plane direction of the dielectric member 31. In this embodiment, a distance ds between the facing first and second signal electrodes 12a and 12b is configured to be larger than a distance dr between the facing first and second control electrodes 13a and 13b. However, embodiments are not limited to this but the distance ds between the facing signal electrodes may also be equal to or less than the distance dr between the facing control electrodes (ds$\leqq$dr) in correspondence with applications and the like.

The example of disposition of the pair of signal electrodes 12a and 12b and the pair of control electrodes 13a and 13b are not limited to this. The directions of the signal electrodes facing each other and the directions of the control electrodes facing each other may not be perpendicular to but may also intersect with each other.

The four low dielectric layers 32 is a layer having an upper face in, for example, a rectangular shape and a layer to reduce the stray capacitance between the signal electrodes and the control electrodes described above. Each of the low dielectric layers 32 is formed of a dielectric material having a permittivity (relative permittivity) sufficiently smaller than the permittivity (relative permittivity) of the dielectric member main body 11. For example, it is formed of a dielectric material having a relative permittivity of, for example, 10 or less. As a material to form the low dielectric layers 32, it is preferred to use a material that can be formed by application (silk screen printing and the like) similar to each of the electrodes from the perspective of easy manufacture of the varactor element. The dielectric material satisfying these conditions may include, for example, dielectric materials of alumina system, magnesium silicate system, and the like. In this embodiment, the four low dielectric layers 32 have a thickness comparable to the thicknesses of the signal electrodes and the control electrodes.

Figure 12:
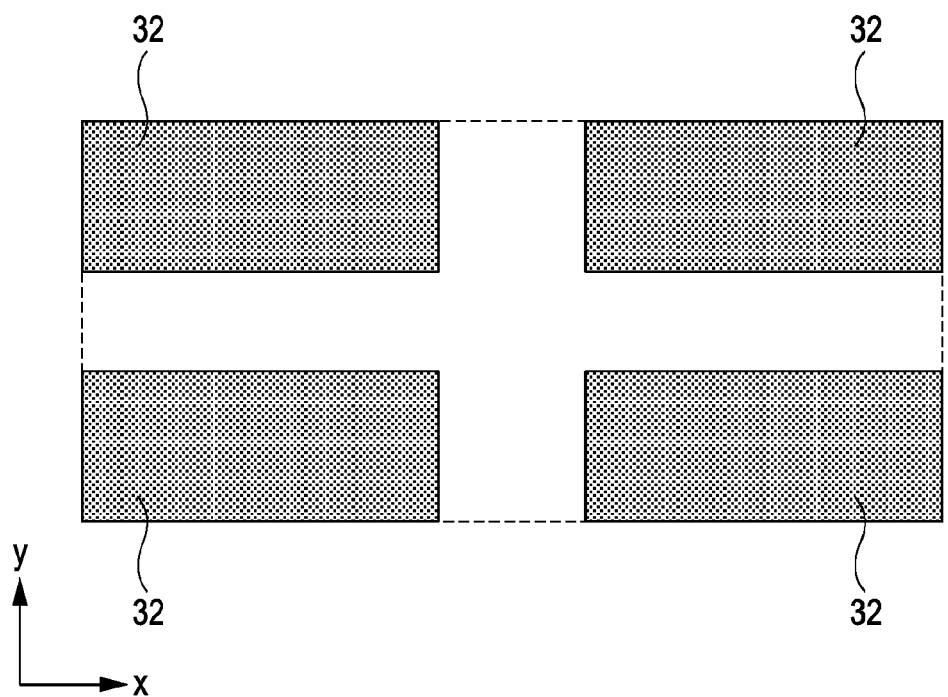
FIG. 12 is a layout drawing of low dielectric layers in the varactor element according to the other embodiment.

FIG. 12 illustrates a layout drawing of the upper face of the four low dielectric layers 32 in this embodiment. In this embodiment, the four low dielectric layers 32 are disposed on a plane approximately identical to the pair of signal electrodes 12a and 12b and the pair of control electrodes 13a and 13b in the in-plane direction of the dielectric member 31. The four low dielectric layers 32 are formed in a region excluding the pair of signal electrodes 12a and 12b, the pair of control electrodes 13a and 13b, and the variable capacitance region 14 (first dielectric layer). More specifically, in this embodiment, the low dielectric layers 32 are formed in a region surrounded by the ends on the longitudinal sides of the signal electrodes, ends on the longitudinal sides of the control electrodes closest to the ends of the signal electrodes, and side faces of the dielectric member 31. By disposing in such a manner, the stray capacitance can be reduced that is generated between the ends on the longitudinal sides of the signal electrodes and the ends on the longitudinal sides of the control electrodes closest to the ends of the signal electrodes.

However, the disposition of the low dielectric layers 32 is not limited to the example of FIG. 12. The low dielectric layers 32 can be disposed in any region as long as it is a region in which the stray capacitance between the signal electrodes and the control electrodes is generated in a plane approximately same as the signal electrodes and the control electrodes.

Method of Fabricating Varactor Element

Figure 13:
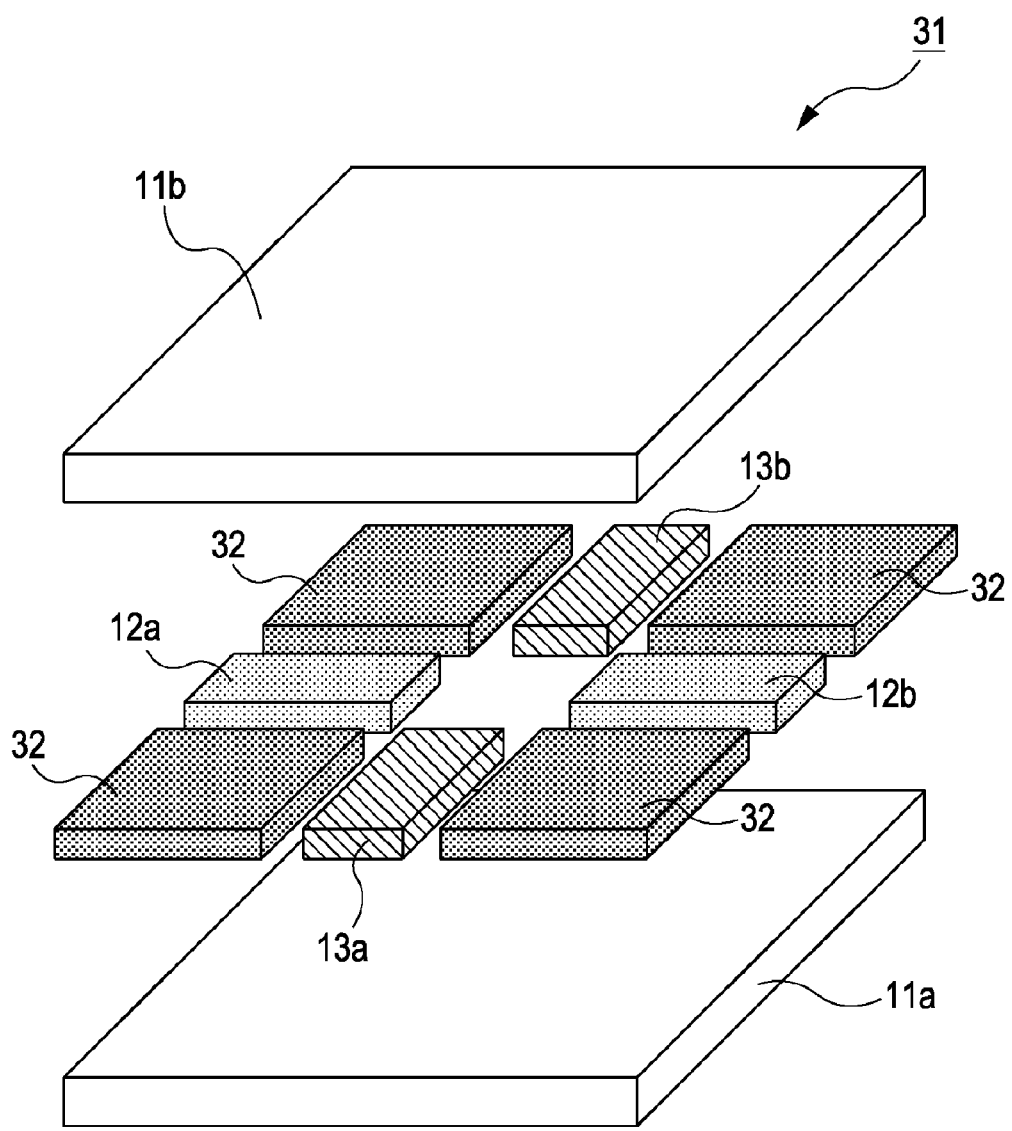
FIG. 13 is an exploded perspective view of the dielectric member in the varactor element according to the other embodiment.
Figure 14A:
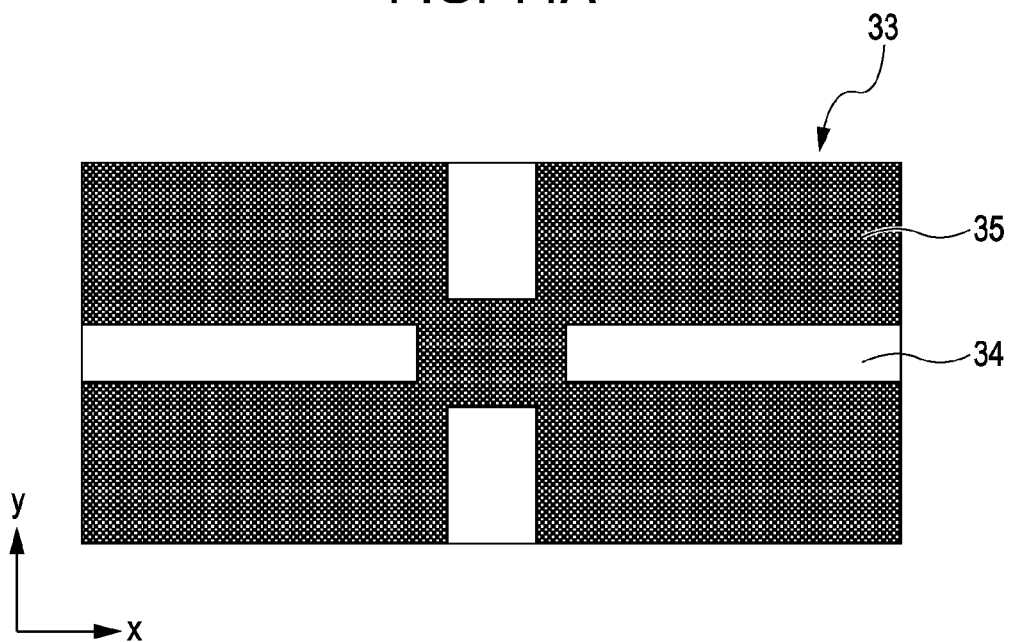
FIG. 14A is a top view of a mask used for forming the signal electrodes and the control electrodes of the varactor element according to the other embodiment.
Figure 14B:
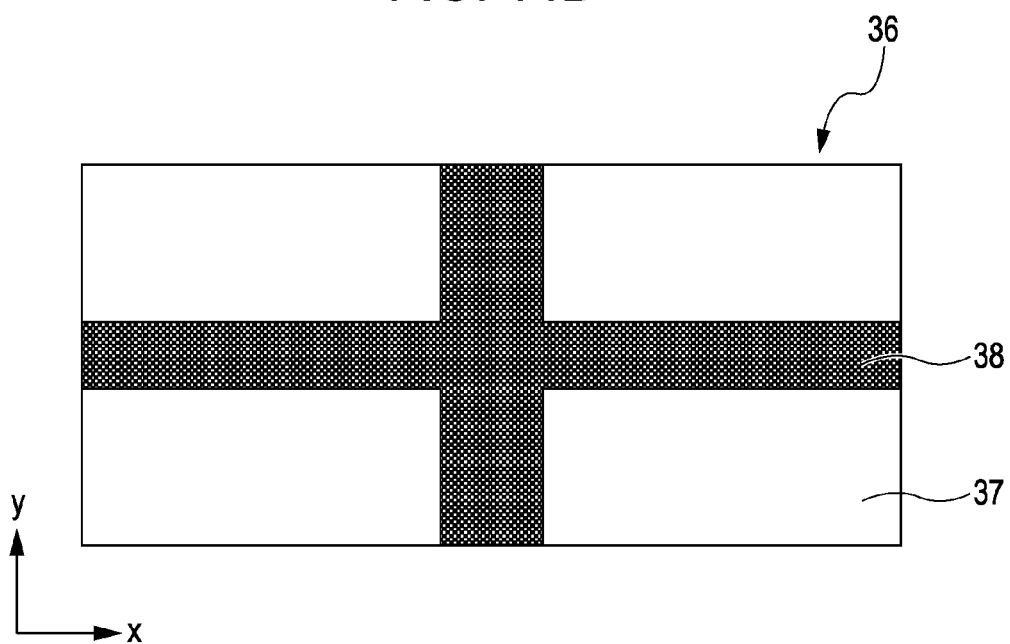
FIG. 14B is a top view of a mask used for forming the low dielectric layers thereof.

Next, a brief description is given to a method of fabricating the varactor element according to this embodiment referring to FIGS. 13 and 14. FIG. 13 is an exploded perspective view of the dielectric member 31 according to this embodiment. FIG. 14A is a top view of the mask used for forming the signal electrodes and the control electrodes, and FIG. 14B is a top view of the mask for forming the low dielectric layers 32.

Firstly, a first dielectric sheet 11a (dielectric layer) is prepared that is formed of a ferroelectric material similar to the material to form a dielectric member described in the previous embodiment. In addition, an electrode-forming mask 33 is prepared that is provided with openings 34 in regions corresponding to the regions to form the signal electrodes and the control electrodes as illustrated in FIG. 14A and a screening area 35 in a region other than those. Further, a low dielectric layer-forming mask 36 is prepared that is provided with openings 37 in regions corresponding to the regions to form the low dielectric layers 32 as illustrated in FIG. 14B and a screening area 38 in a region other than those.

Subsequently, a conductive paste is prepared by making metal fine powder of, for example, Pd, Pd/Ag, Ni, or the like into a paste, and the conductive paste is applied (silk screen printing or the like) on a first dielectric sheet 11a via the electrode-forming mask 33. In this way, the first and second signal electrodes 12a and 12b and the first and second control electrodes 13a and 13b are formed on one of the surfaces of the first dielectric sheet 11a.

Subsequently, a paste material including a low dielectric having a relative permittivity of, for example, 10 or less is applied (silk screen printing) on the first dielectric sheet 11a via the low dielectric layer-forming mask 36. In this way, the four low dielectric layers 32 are formed on one of the surfaces of the first dielectric sheet 11a on which the first and second signal electrodes 12a and 12b and the first and second control electrodes 13a and 13b are formed.

Subsequently, a second dielectric sheet 11b that is formed of a ferroelectric material similar to the material to form a dielectric member described in the previous embodiment is laminated on the surface of the first dielectric sheet 11a on which the electrodes are formed for thermocompression. Then, the thermocompressed member is sintered in a reducing atmosphere at a high temperature to integrate the first and second dielectric sheets 11a and 11b, the signal electrodes, the control electrodes, and the low dielectric layers 32. In this embodiment, the varactor element intersecting in plane is fabricated in such a manner.

Figure 15A:
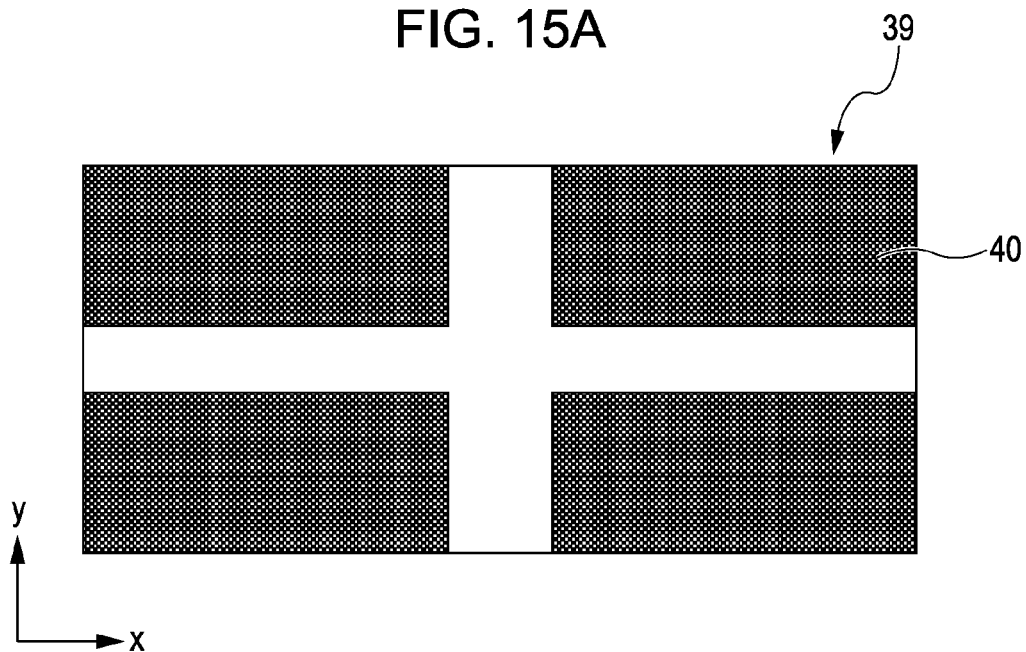
FIGS. 15A and 15B illustrate another configuration example of a mask used for forming the signal electrodes and the control electrodes.
Figure 15B:
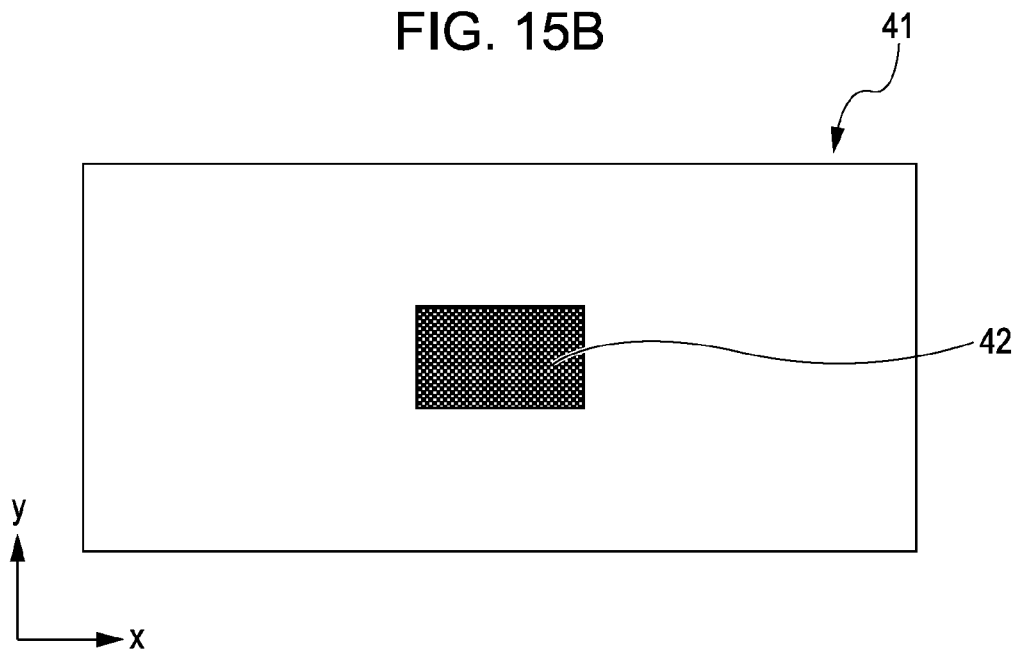

The electrode-forming mask 33 (FIG. 14A) described above used for fabricating the dielectric member 31 according to this embodiment can also be configured using two masks illustrated in FIGS. 15A and 15B. A mask 39 illustrated in FIG. 15A is a mask provided with screening areas 40 in regions corresponding to the regions to form the low dielectric layers 32. A mask 41 illustrated in FIG. 15B is a mask formed with a screening area 42 in the region corresponding to the vicinity of the variable capacitance region 14. The two masks illustrated in FIGS. 15A and 15B are used by overlapping, and thereby a mask pattern similar to the electrode-forming mask 33 illustrated in FIG. 14A can be configured.

Since the mask 39 in FIG. 15A is a mask having a reversal pattern of the openings of the low dielectric layer-forming mask 36 illustrated in FIG. 14B, the mask data for fabricating the low dielectric layer-forming mask 36 can be utilized to fabricate the mask 39. Therefore, in a case of configuring the electrode-forming mask 33 using two masks illustrated in FIGS. 15A and 15B, the electrode-forming mask is easily fabricated.

Behavior of Varactor Element

Figure 16:
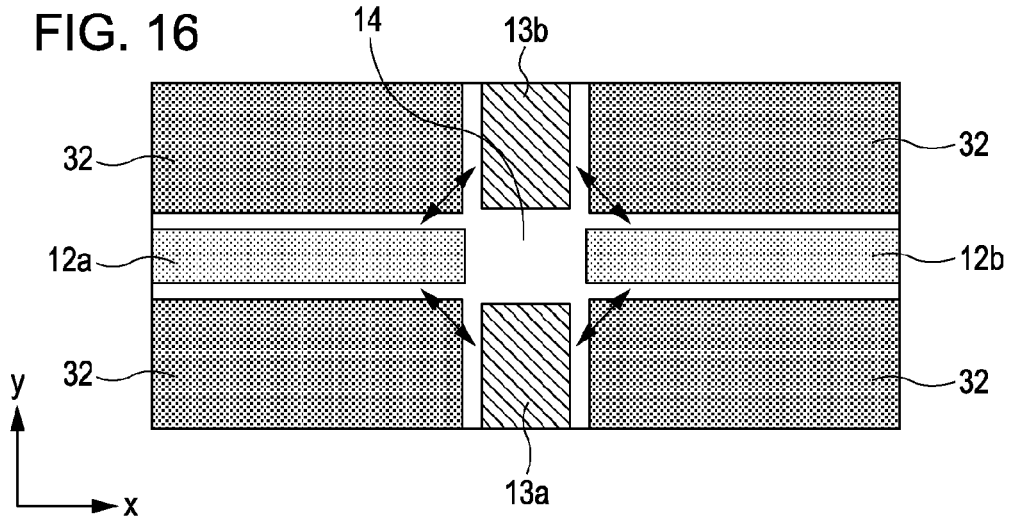
FIG. 16 illustrates a behavioral outline of the varactor element according to the other embodiment.

FIG. 16 illustrates a transparent view of the dielectric member 31 in the varactor element according to this embodiment taken from the upper face thereof. In this embodiment, similar to the previous embodiment, the pair of signal electrodes 12a and 12b (terminals) and the pair of control electrodes 13a and 13b (terminals) are provided separately. In this embodiment, each of the electrodes is disposed in such a manner that the directions of the pair of signal electrodes 12a and 12b facing each other and the directions of the pair of control electrodes 13a and 13b facing each other become perpendicular to each other. Then, the capacitance value of the signal capacitor between the pair of signal electrodes 12a and 12b is controlled by the control field generated between the pair of control electrodes 13a and 13b.

Therefore, in this embodiment, similar to the previous embodiment, the relative permittivity, the electrode area, and electrode distance, which are the three elements determining the capacitance, can be separately established for the signal electrodes and the control electrodes respectively. That is, according to this embodiment, the withstanding voltage performance between the signal terminals and the withstanding voltage performance between the control terminals can be separately designed, and thus the sensitivity of the control field between the control terminals can be established regardless of the withstanding voltage performance relative to the signal voltage. In addition, according to this embodiment, it is possible to provide a varactor element that maintains the capacitance unchanged by the level of the signal inputted between the signal terminals.

In addition, in this embodiment, since the pair of signal electrodes 12a and 12b and the pair of control electrodes 13a and 13b are formed on an identical plane in the dielectric member 31, the above problem generated due to the misalignment of each of the electrodes when laminating the dielectric sheets can be eliminated similar to the previous embodiment.

Further in this embodiment, since the low dielectric layers 32 are formed between the signal electrodes and the control electrodes on a plane identical to the plane on which the signal electrodes and the control electrodes are formed in the dielectric member 31, the stray capacitance (arrows in FIG. 16) generated between the signal electrodes and the control electrodes can be made smaller. Therefore, in this embodiment, deterioration in the properties of the varactor element due to the stray capacitance (for example, a decrease of the variation range of the capacitance and the like) can be suppressed.

First Modification

Figure 17:
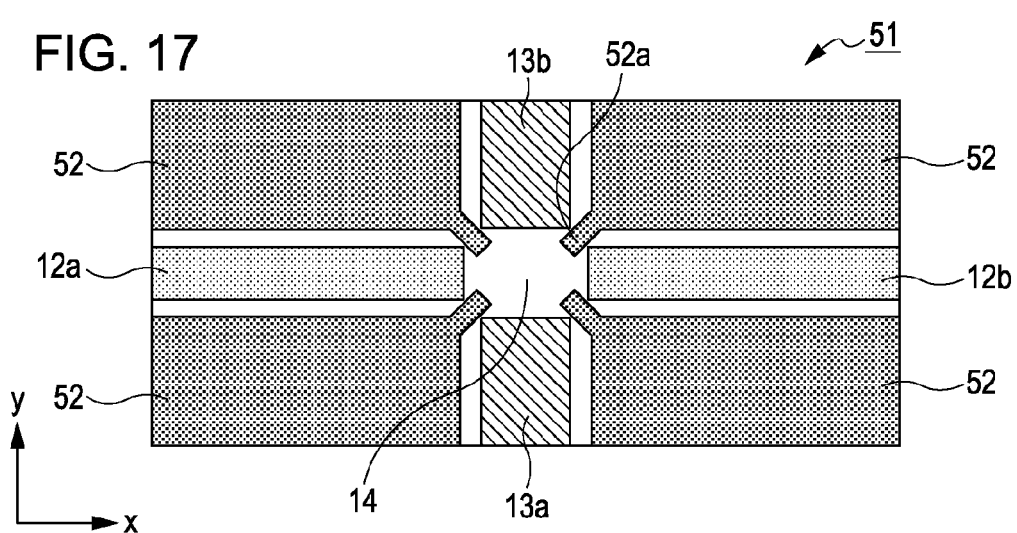
FIG. 17 illustrates a configuration of signal electrodes, control electrodes, and low dielectric layers of a varactor element according to a first modification.

The configuration of a varactor element that reduces the stray capacitance generated between the signal electrodes and the control electrodes is not limited to the above configuration example according to the embodiment described secondly. FIG. 17 illustrates another configuration example (first modification) of a varactor element that reduces the stray capacitance generated between the signal electrodes and the control electrodes. FIG. 17 is a transparent view of a dielectric member of a varactor element according to the first modification taken from the upper face thereof. In FIG. 17, components similar to the embodiment described secondly (FIG. 16) are assigned to the same reference numerals and characters.

As is apparent from a comparison between FIGS. 16 and 17, a dielectric member 51 in this example has a configuration similar to that of the embodiment described secondly other than modifying a configuration of low dielectric layers 52. Therefore, a description is given in this section only to the configuration of the low dielectric layers 52.

In this example, similar to the embodiment described secondly, the four low dielectric layers 52 are formed in regions other than the variable capacitance region 14. The low dielectric layers 52 are formed of a low dielectric material similar to that of the low dielectric layers 32 according to the embodiment described secondly.

Further in this example, each of the low dielectric layers 52 has an upper face in, for example, an approximately rectangular shape and has a convex 52a (referred to below as a guard area 52a) projecting towards the variable capacitance region 14 provided at a corner area closest to the variable capacitance region 14 out of the four corner areas. Then, the guard areas 52a are disposed between the corner areas in which the signal electrodes face the control electrodes.

As described above, in the varactor element according to this example, the guard areas 52a formed of a low dielectric material are formed in the regions of shortest distances between the signal electrodes and the control electrodes. Therefore, in this example, the stray capacitance generated between the signal electrodes and the control electrodes can be reduced even more and the deterioration in the properties of the varactor element due to the stray capacitance (for example, a decrease of the variation range of the capacitance and the like) can be suppressed.

Second Modification

Figure 18:
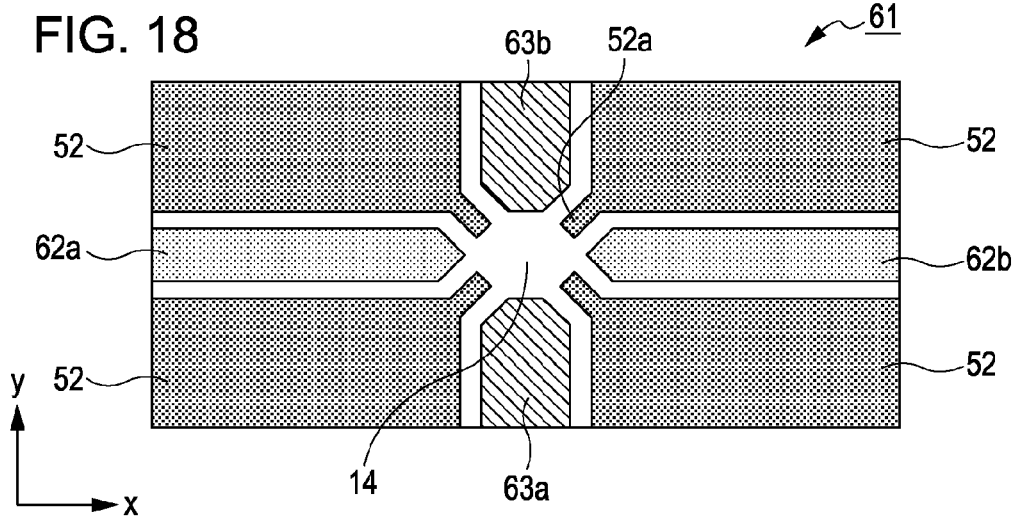
FIG. 18 illustrates a configuration of signal electrodes, control electrodes, and low dielectric layers of a varactor element according to a second modification.

FIG. 18 illustrates still another configuration example (second modification) of a varactor element that reduces the stray capacitance generated between the signal electrodes and the control electrodes. FIG. 18 is a transparent view of a dielectric member in a varactor element according to the second modification taken from the upper face thereof. In FIG. 18, components similar to the first modification (FIG. 17) are assigned to the same reference numerals and characters.

As apparent from a comparison between FIGS. 17 and 18, a dielectric member 61 according to this example has a configuration similar to that of the first modification other than modifying a configuration of a pair of signal electrodes 62a and 62b (first and second signal electrodes) and a pair of control electrodes 63a and 63b (first and second control electrodes). Therefore, a description is given in this section only to the configuration of the signal electrodes and the control electrodes.

In this example, both of the first and second signal electrodes 62a and 62b are configured with electrodes having an upper face in, for example, approximately rectangular shape and are disposed so as to each have an end on one of the transverse side facing each other separated at a predetermined interval similar to the embodiment described secondly. In the example illustrated in FIG. 18, the first and second signal electrodes 62a and 62b face each other parallel to the x direction.

Both of the first and second control electrodes 63a and 63b are configured with electrodes having an upper face in, for example, an approximately rectangular shape. Then, the first and second control electrodes 63a and 63b are disposed so as to each have an end on one of the transverse side facing each other separated at a predetermined interval and also are disposed perpendicular to the directions of the first and second signal electrodes 62a and 62b facing each other similar to the embodiment described secondly. That is, in the example illustrated in FIG. 18, the first and the second control electrodes 63a and 63b face each other parallel to the y direction. Then, also in this example, the first and second signal electrodes 62a and 62b and the first and second control electrodes 63a and 63b are disposed in an approximately identical plane in the in-plane direction of the dielectric member 61 similar to the embodiment described secondly.

Further in this example, a tip end of each electrode positioned close to the variable capacitance region 14 is arranged in a shape of the electrode width narrowing towards the variable capacitance region 14 (in a convex). That is, the electrodes are in a shape with no corner area provided in the regions in which the signal electrodes and the control electrodes face each other sandwiching the guard areas 52a of the low dielectric layers 52.

As described above, in the varactor element according to this example, since the guard areas 52a of the low dielectric layers 52 are formed in the regions of the shortest distances between the signal electrodes and the control electrodes similar to the first modification, the stray capacitance generated between the signal electrodes and the control electrodes can be reduced even more.

In this example, since no corner area is formed in the regions of the signal electrodes and the control electrodes facing each other sandwiching the guard areas 52a of the low dielectric layers 52, the field concentration can be avoided between the signal electrodes and the control electrodes in this region and the stray capacitance can be reduced even more.

Further in this example, since the regions to form the guard areas 52a in the low dielectric layers 52 are wider compared to those of the first modification, the low dielectric layers 52 are formed more easily.

Third Modification

Figure 19A:
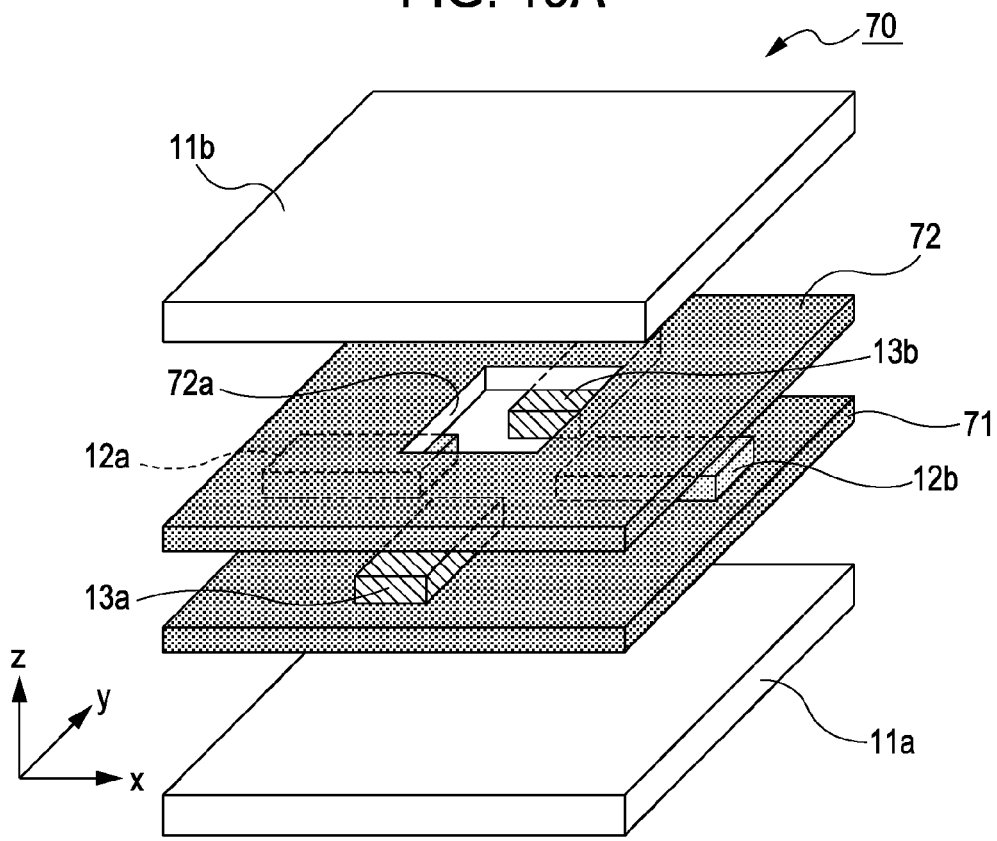
FIG. 19A is an exploded perspective view of a dielectric member of a varactor element according to a third modification.
Figure 19B:
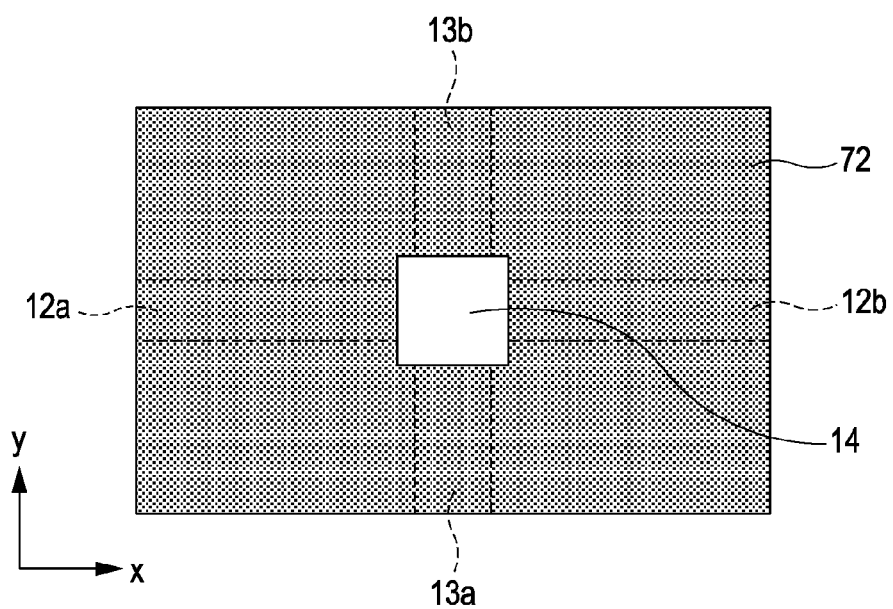
FIG. 19B illustrates a configuration of signal electrodes, control electrodes, and low dielectric layers of the varactor element according to the third modification.

Although descriptions are given above to the examples of forming the low dielectric layers in the regions other than the pair of signal electrodes, the pair of control electrodes, and the variable capacitance region in the embodiment described secondly and the first and second modifications, embodiments are not limited to them. For example, low dielectric layers may also be configured to cover a region other than the variable capacitance region. FIGS. 19A and 19B illustrate a configuration example (third modification) of such a varactor element. FIG. 19A is an exploded perspective view of a dielectric member of a varactor element according to this example, and FIG. 19B is a transparent view of the dielectric member according to this example taken from the upper face thereof. In FIGS. 19A and 19B, components similar to the embodiment described secondly (FIG. 13) are assigned to the same reference numerals and characters.

As apparent from a comparison between FIGS. 19A and 13, a dielectric member 70 in this example has low dielectric layers with a configuration modified from that of the dielectric member 31 according to the embodiment described secondly. The configuration other than that is similar to the embodiment described secondly. Therefore, a description is given in this section only to a configuration of the low dielectric layers.

The dielectric member 70 in this example is provided with two low dielectric layers 71 and 72. In this embodiment, the two low dielectric layers 71 and 72 have the same configuration. The low dielectric layer 72 is a sheet form member having a width and a length comparable to those of the second dielectric sheet 11b (or the first dielectric sheet 11a). Then, an opening 72a is formed in a region corresponding to the variable capacitance region 14 of the varactor element. The thickness of the low dielectric layer 72 is comparable to the thickness of the electrodes.

In this example, the first and second signal electrodes 12a and 12b and the first and second control electrodes 13a and 13b are disposed between the two low dielectric layers 71 and 72 as illustrated in FIG. 19A. Therefore, in the dielectric member 70 according to this example, the low dielectric layers are formed so as to wrap around the upper and lower faces and longitudinal side faces of each of the electrodes except the variable capacitance region 14 by integrating each layer.

As described above, in the varactor element according to this example, the low dielectric layers are formed not only between the side faces of the signal electrodes and the control electrodes but also between the upper and lower faces of each electrode and the dielectric member main body. Therefore, in the varactor element according to this example, the stray capacitance generated between the signal electrodes and the control electrodes via the dielectric member main body can also be reduced. Accordingly, in this example, the stray capacitance can be reduced even more compared to the varactor elements in the embodiment described secondly and the first and second modifications.

Although a description is given in the third modification to the example of forming the low dielectric layers on the upper and lower faces of the signal electrodes and the control electrodes, embodiments are not limited to this. Such a low dielectric layer may also be formed only on one of the upper and the lower faces of the signal electrode and the control electrodes.

Fourth Modification

Although descriptions are given above to the types of disposing the signal electrodes and the control electrodes on an approximately identical plane in the in-plane direction of the dielectric member, that is, the examples of forming the low dielectric layers in the varactor elements intersecting in plane in the embodiment described secondly and the first through third modifications, embodiments are not limited to them. For example, such low dielectric layers may also be applied to a varactor element intersecting parallel to the thickness as illustrated in FIGS. 6 through 8. In the fourth modification, a description is given to a configuration example of a varactor element intersecting parallel to the thickness having low dielectric layers.

Figure 20:
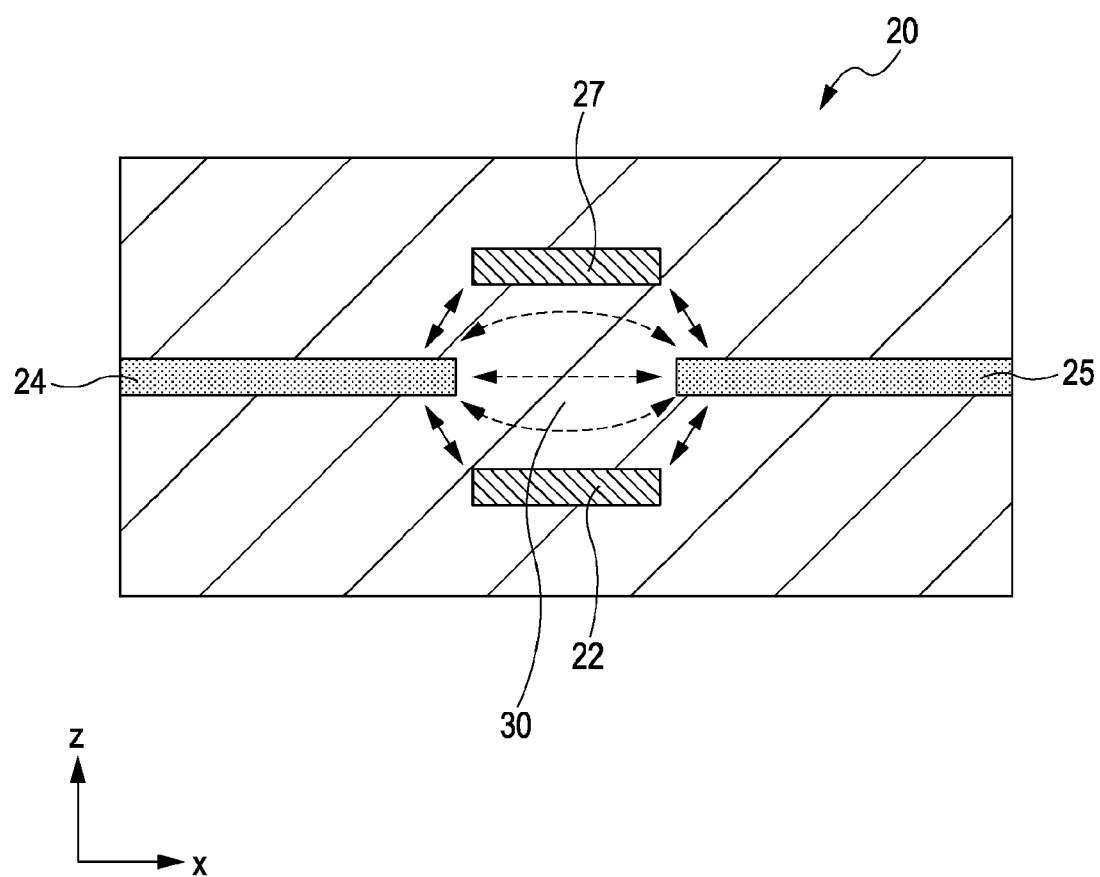
FIG. 20 illustrates a state of stray capacitance generated between the signal electrodes and the control electrodes in a varactor element intersecting parallel to the thickness.

Before describing specific configuration of the varactor element according to this example, a brief description is given to the mode of stray capacitance generation in a varactor element intersecting parallel to the thickness. FIG. 20 illustrates a mode of stray capacitance generation in a varactor element intersecting parallel to the thickness. In a varactor element of this type, as the distance between the first and second control electrodes 22 and 27 becomes shorter, the stray capacitance is generated parallel to the thickness of the dielectric member 20 between the signal electrodes and the control electrodes in a region other than the a variable capacitance region 30 as illustrated by the arrows of solid lines in FIG. 20. In this case, similar to the varactor elements intersecting in plane, there is also a problem of, for example, the variation range of the capacitance of the varactor element made smaller.

Figure 21A:
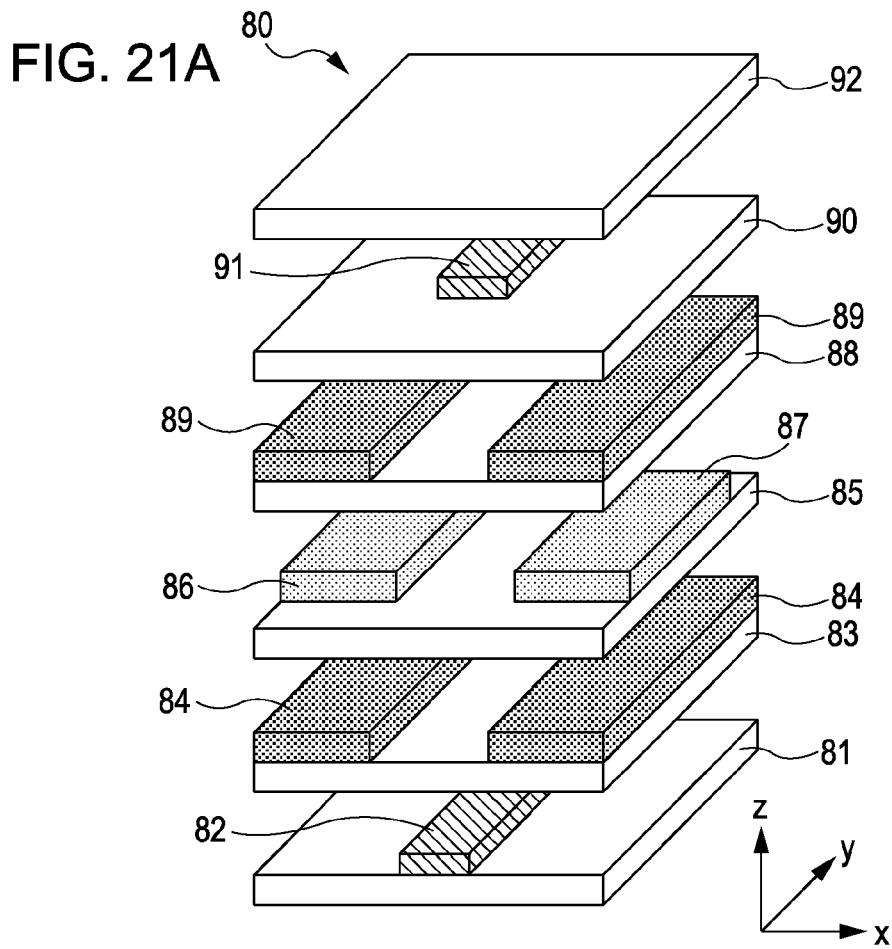
FIG. 21A is an exploded perspective view of a dielectric member of a varactor element according to a fourth modification.
Figure 21B:
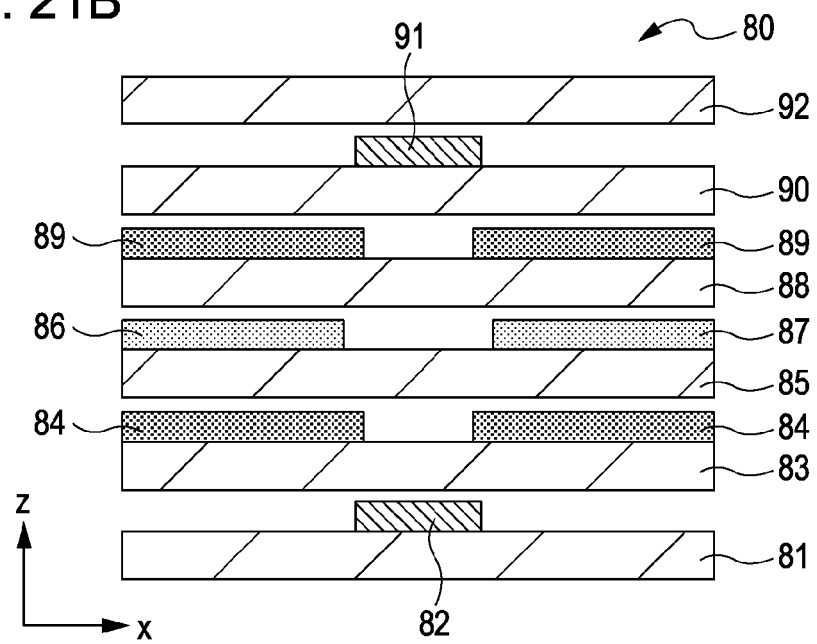
FIG. 21B is an exploded side view of the dielectric member according to the fourth modification.

FIGS. 21A and 21B illustrate a configuration example of a varactor element intersecting parallel to the thickness according to the fourth modification. FIG. 21A is an exploded perspective view of a dielectric member of a varactor element according to this example, and FIG. 21B is an exploded side view of the dielectric member taken from the y direction in FIG. 21A.

A dielectric member 80 of the varactor element according to this example is provided with a first dielectric sheet 81 having a first control electrode 82 formed on the surface, a second dielectric sheet 83 having a pair of low dielectric layers 84 formed on the surface, and a third dielectric sheet 85 having a pair of signal electrodes 86 and 87 formed on the surface. The dielectric member 80 is further provided with a fourth dielectric sheet 88 having a pair of low dielectric layers 89 formed on the surface, a fifth dielectric sheet 90 having a second control electrode 91 formed on the surface, and a sixth dielectric sheet 92 covering the second control electrode 91.

In this example, the second through sixth dielectric sheets are laminated on the first dielectric sheet 81 in this order, and they are laminated so as to sandwich the electrodes or the low dielectric layers between the respective dielectric sheets. Then, in the state of laminating each of the dielectric sheets, it is thermocompressed and sintered at a high temperature similar to the embodiment described secondly to integrate the dielectric sheets, the electrodes, and the low dielectric layers and form the dielectric member 80. Each of the dielectric sheets can be formed of a ferroelectric material similar to the material to form the dielectric member in the embodiment described firstly. Each of the electrodes can also be formed of a material similar to the material to form the signal electrodes and the control electrodes of the embodiment described firstly. Each of the low dielectric layers can be formed of a dielectric material similar to the material to form the low dielectric layers of the embodiment described secondly and can also have a thickness comparable to each of the electrodes.

Figure 22A:
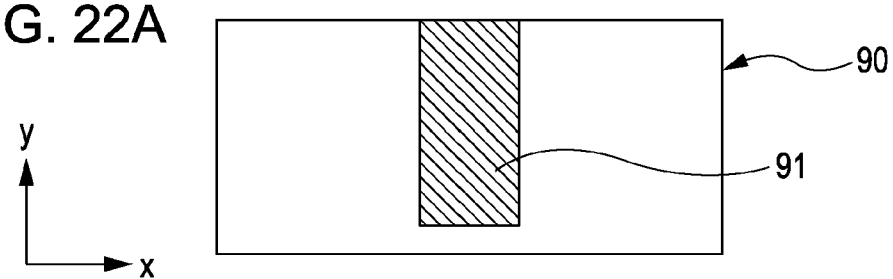
FIGS. 22A through 22E are top views of individual layers configuring the dielectric member according to the fourth modification.
Figure 22B:
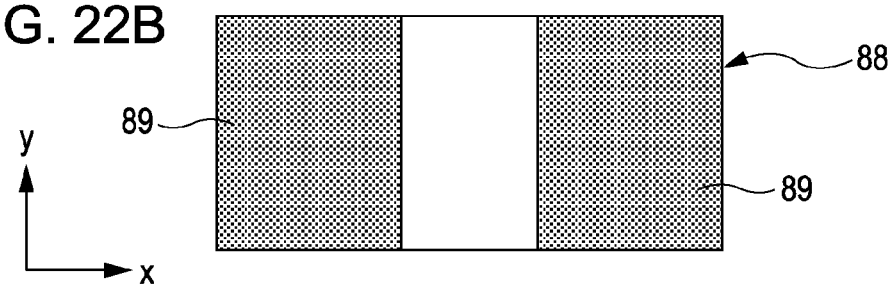
Figure 22C:
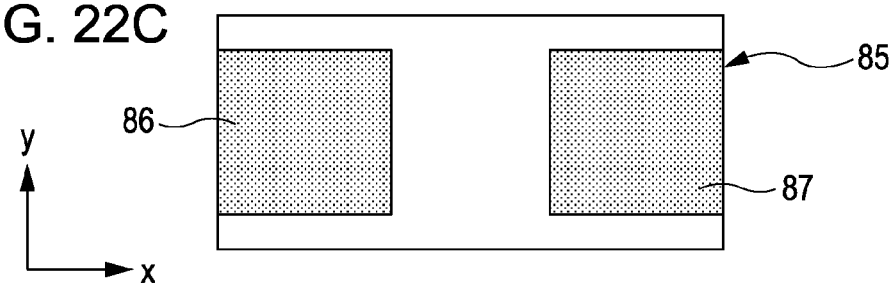
Figure 22D:
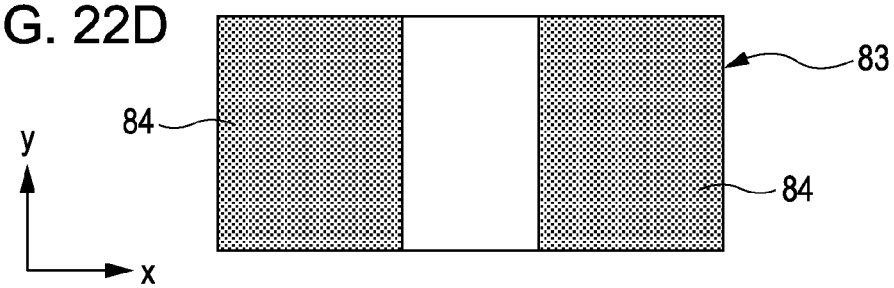
Figure 22E:
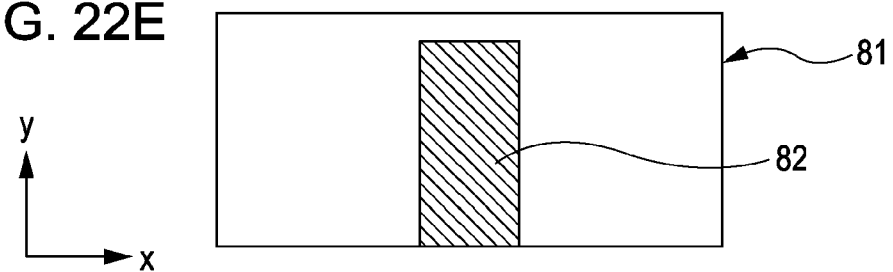

FIGS. 22A through 22E illustrate a configuration of the electrodes or the low dielectric layers formed on each of the dielectric sheets according to this example. FIG. 22A is a top view of the fifth dielectric sheet 90, FIG. 22B is a top view of the fourth dielectric sheet 88, and FIG. 22C is a top view of the third dielectric sheet 85. FIG. 22D is a top view of the second dielectric sheet 83, and FIG. 22E is a top view of the first dielectric sheet 81.

On the fifth dielectric sheet 90, as illustrated in FIG. 22A, the second control electrode 91 is formed that extends along a direction from the center at an end on one of the longitudinal sides parallel to the transverse sides (y direction in FIG. 20A).

On the fourth dielectric sheet 88, as illustrated in FIG. 22B, the pair of low dielectric layers 89 is formed that has an upper face in, for example, a rectangular shape or the like and is separated at a predetermined interval and is disposed in the vicinity of both ends on the transverse sides of the fourth dielectric sheet 88. Preferably, the distance between the pair of low dielectric layers 89 is established as equal to or more than the width of the second control electrode 91 (or the first control electrode 82) and also is smaller than the distance between the pair of signal electrodes 86 and 87. In this example, the fourth dielectric sheet 88 having the pair of low dielectric layers 89 formed on the surface has a configuration same as that of the second dielectric sheet 83 having the pair of low dielectric layers 84 formed on the surface (refer to FIG. 22D).

On the third dielectric sheet 85, as illustrated in FIG. 22C, the pair of signal electrodes 86 and 87 is formed that has an upper face in, for example, a rectangular shape or the like and is separated at a predetermined interval and is disposed in the vicinity of both ends on the transverse sides of the third dielectric sheet 85. The distance between the pair of signal electrodes 86 and 87 is preferably established as equal to or more than the width of the first control electrode 82 (or the second control electrode 91). In the example in FIG. 22C, the pair of signal electrodes 86 and 87 has a same configuration.

On the first dielectric sheet 81, as illustrated in FIG. 22E, the first control electrode 82 is formed that extends along a direction from the center at an end on the other of the longitudinal sides parallel to the transverse sides (y direction in FIG. 22E) and has an upper face in, for example, a rectangular shape. In this example, the first and second control electrodes 82 and 91 have a same configuration.

Figure 23A:
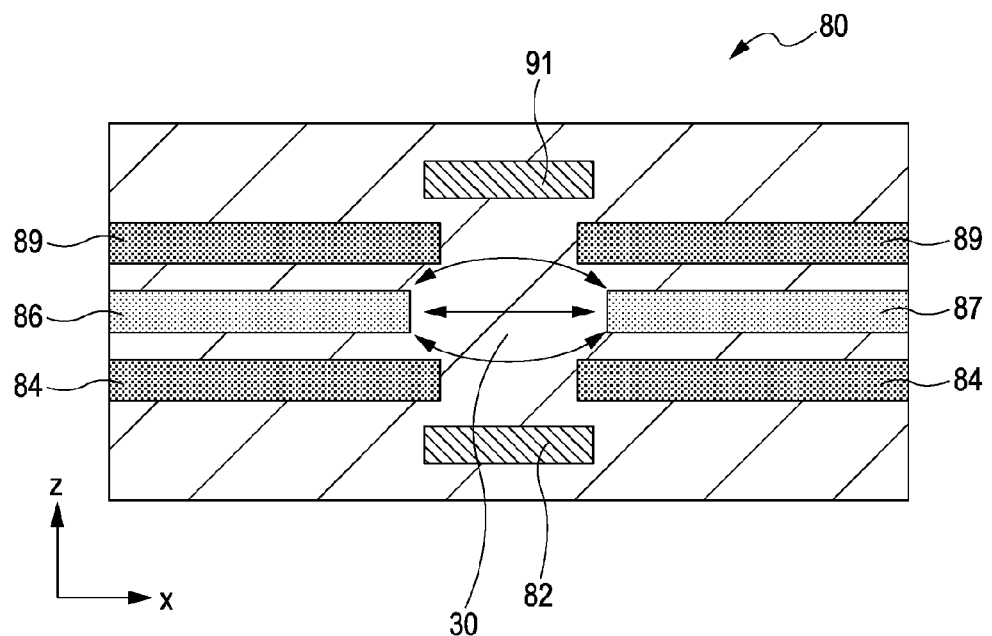
FIG. 23A is a schematic cross-sectional view of the dielectric member according to the fourth modification.
Figure 23B:
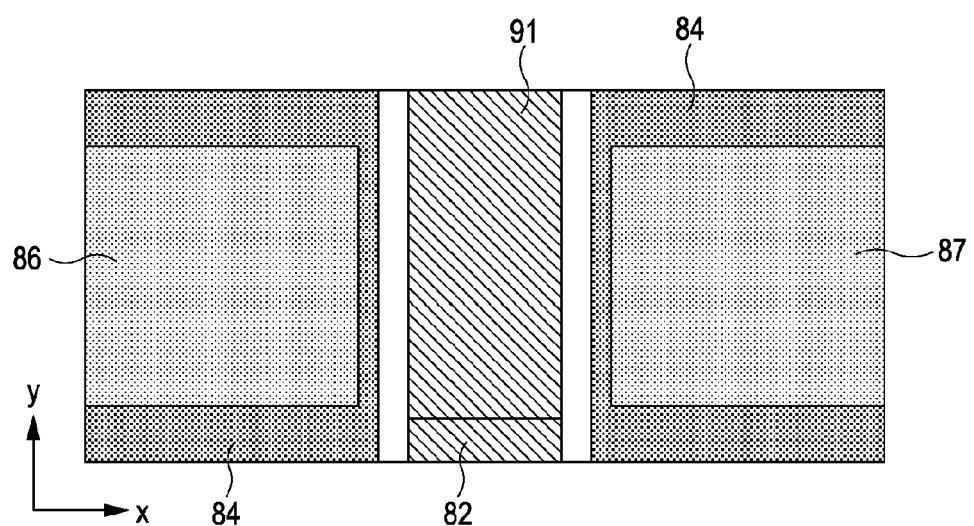
FIG. 23B is a transparent view of the dielectric member of the varactor element according to the fourth modification taken from an upper face thereof.

FIGS. 23A and 23B illustrate a configuration of the dielectric member 80 after laminating each of the dielectric sheets for integration in this example. FIG. 23A is a schematic cross-sectional view of the dielectric member 80, and FIG. 23B is a transparent view of the dielectric member 80 taken from the upper face thereof. In this example, when each of the dielectric sheets are laminated in which the electrodes and the low dielectric layers are formed of the configuration as illustrated in FIGS. 22A through 22E for integration, the first and second control electrodes 82 and 91 are disposed facing each other parallel to the thickness of the dielectric member 80 (z direction in FIG. 23A). In contrast, the pair of signal electrodes 86 and 87 are disposed facing each other on an identical plane in the in-plane direction of the dielectric member 80.

In this example, the low dielectric layers 84 and 89 are formed respectively at an intermediate position between the signal electrodes and the control electrodes parallel to the thickness of the dielectric member 80, and the vicinities of tip ends of the low dielectric layers 84 and 89 are disposed respectively between the longitudinal ends of the control electrodes and the tip end of the signal electrodes closest to the ends. In this case, the stray capacitance can be reduced that is generated between the longitudinal ends of the control electrodes and the tip ends of the signal electrodes closest to the ends. Therefore, also in the varactor element according to this example, the deterioration (for example, a decrease in the variation range of the capacitance and the like) in the properties of the varactor element due to the stray capacitance generated between the signal electrodes and the control electrodes can be suppressed even more.

In the varactor element according to this example, similar to the above embodiments, the pair of signal electrodes 86 and 87 and the pair of control electrodes 82 and 91 are provided separately. Each of the electrodes is disposed in such a manner that the directions of the pair of signal electrodes 86 and 87 facing each other is perpendicular to the directions of the pair of control electrodes 82 and 91 facing each other. Then, the control field is generated in a direction intersecting the direction of the signal field generated between the pair of signal electrodes 86 and 87 to control the capacitance value between the pair of signal electrodes 86 and 87.

Therefore, also in this example, similar to the embodiments above, the withstanding voltage performance between the signal terminals and the withstanding voltage performance between the control terminals can be designed separately, and thus the sensitivity of the control field between the control terminals can be established regardless of the withstanding voltage performance relative to the signal voltage. In this example, similar to the above embodiments, it is possible to provide a varactor element that maintains the capacitance unchanged by the level of a signal inputted between the signal terminals.

Fifth Modification

In the fifth modification, a description is given to another configuration example of a varactor element intersecting parallel to the thickness having low dielectric layers.

Figure 24A:
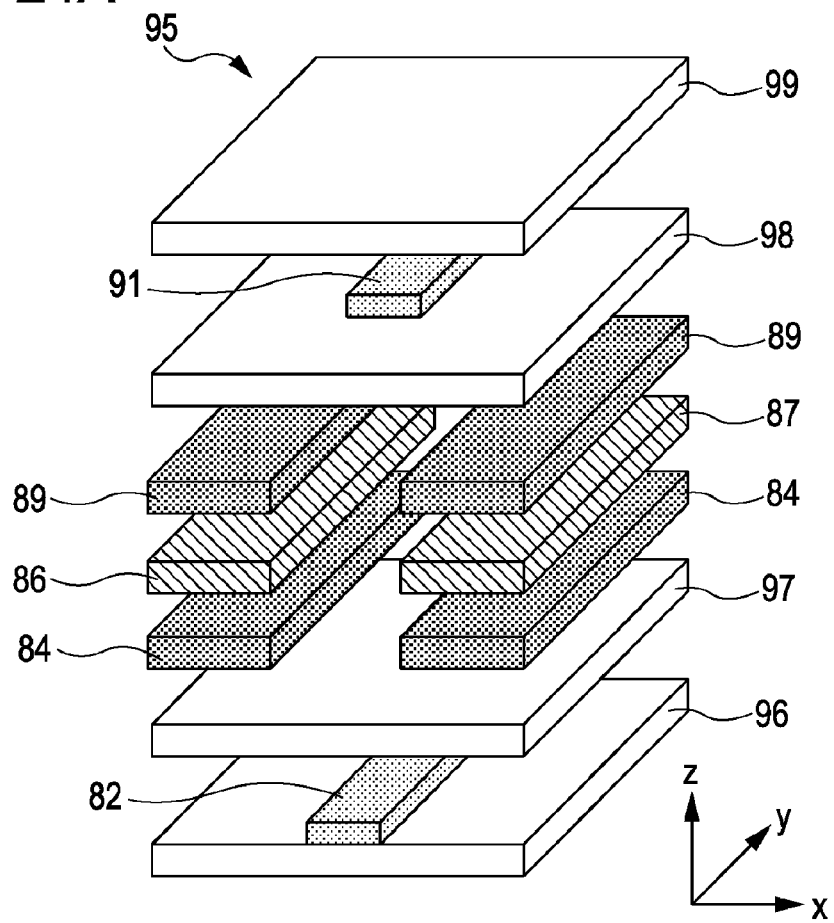
FIG. 24A is an exploded perspective view of a dielectric member of a varactor element according to a fifth modification.
Figure 24B:
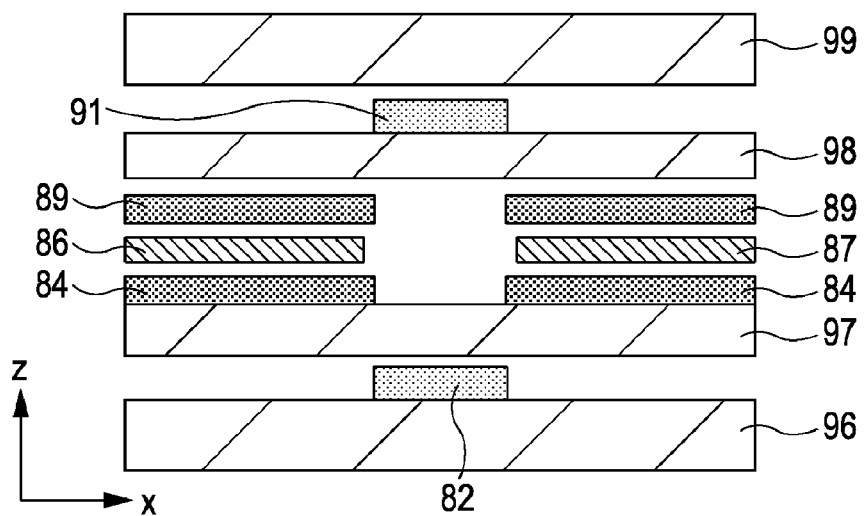
FIG. 24B is an exploded side view of the dielectric member according to the fifth modification.

FIGS. 24A and 24B illustrate a configuration example of a varactor element intersecting parallel to the thickness according to the fifth modification. FIG. 24A is an exploded perspective view of a dielectric member of a varactor element according to this example, and FIG. 24B is an exploded side view taken from the y direction in FIG. 24A. In FIGS. 24A and 24B, components similar to the fourth modification (FIGS. 21A and 21B) are assigned to the same reference numerals.

A dielectric member 95 of the varactor element according to this example is provided with a first dielectric sheet 96 having a first control electrode 82 formed on the surface and a second dielectric sheet 97 having a pair of low dielectric layers 84, a pair of signal electrodes 86 and 87, and a pair of low dielectric layers 89 formed on the surface in this order. The dielectric member 95 is further provided with a third dielectric sheet 98 having a second control electrode 91 formed on the surface and a fourth dielectric sheet 99 covering the second control electrode 91.

As apparent from a comparison between FIGS. 24A and 24B and FIGS. 21A and 21B, this example has a configuration in the dielectric member 80 according to the fourth modification of omitting the third and fourth dielectric sheets 85 and 88 and directly forming the pair of signal electrodes 86 and 87 and the pair of low dielectric layers 89 in this order on the pair of low dielectric layers 84. The configuration other than them is similar to that of the fourth modification.

Figure 25:
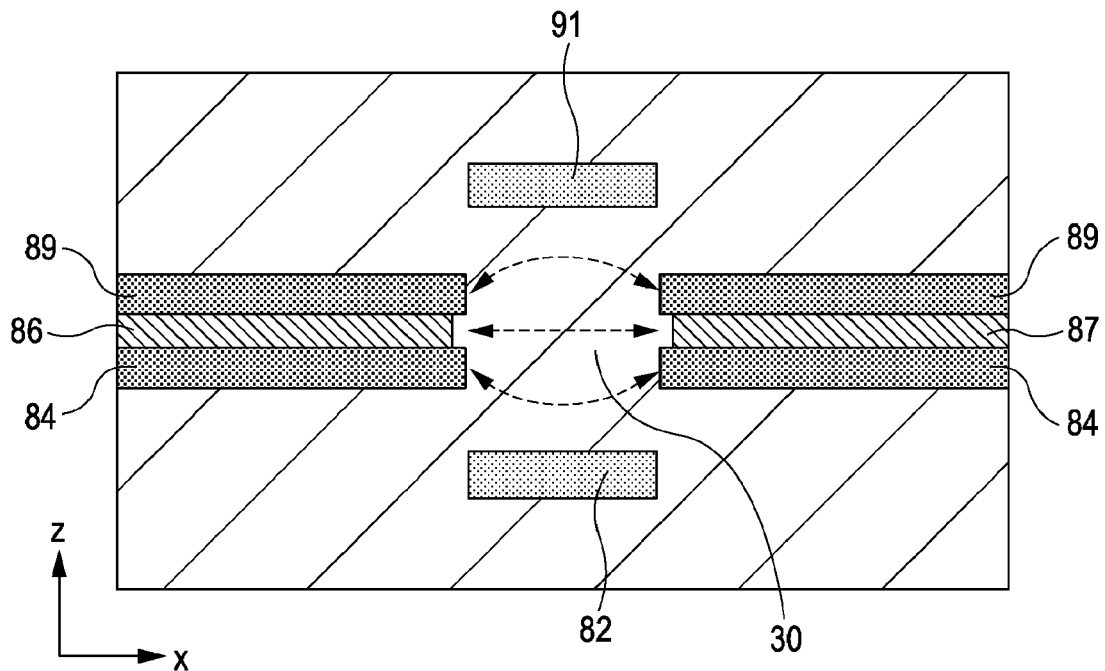
FIG. 25 is a schematic cross-sectional view of the dielectric member according to the fifth modification.

FIG. 25 illustrates a schematic cross-sectional view of the dielectric member 95 in this example after laminating each of the dielectric sheets for integration. By laminating each of the dielectric sheets described above for integration, the pair of signal electrodes 86 and 87 are in a state of directly sandwiched by the pair of low dielectric layers 84 and the pair of low dielectric layers 89.

In the configuration according to this example as well, similar to the fourth modification, the low dielectric layers 84 and 89 are formed respectively between the signal electrodes and the control electrodes parallel to the thickness of the dielectric member 95. Therefore, in this example as well, similar to the fourth modification, the stray capacitance generated between the control electrodes and the signal electrodes can be reduced by the low dielectric layers and the influence over the properties of the varactor element due to the stray capacitance can be suppressed.

In addition, since the number of the dielectric sheets between the control electrodes in the varactor element according to this example can be less compared to the fourth modification, the distance between the control electrodes can be shorter compared to that in the fourth modification. Therefore, in the varactor element according to this example, it becomes possible to drive at a lower voltage compared to the fourth modification. However, from the perspective of ease of method of manufacturing the varactor element, it is easier to form each of the electrodes and the low dielectric layers respectively on the separate dielectric sheets as in the varactor element according to the fourth modification. That is, the varactor element according to the fourth modification can be manufactured more simply compared to that of the fifth modification.

Sixth Modification

Although the configuration examples having a region in which the two control electrodes overlap viewed from the upper face of the varactor element are illustrated with the varactor elements intersecting parallel to the thickness described in the fourth and fifth modifications, embodiments are not limited to them. In the configuration of the varactor element according to the fourth or fifth modification, the pair of control electrodes may also be configured in such a manner that the two control electrodes do not overlap viewed from the upper face of the varactor element (sixth modification).

For example, the disposition of a pair of control electrodes and a pair of signal electrodes viewed from the upper face of a varactor element is arranged to be similar to the embodiment described firstly (FIGS. 3A and 3B), and the pair of the control electrodes is formed respectively on dielectric layers upper and lower from the dielectric layer in which the pair of signal electrodes is formed. In this case, the direction of the control field produced between the pair of control electrodes becomes tilted relative to the thickness and in-plane directions of the varactor element. Then, in such a configuration, not only effects similar to those of the fourth and fifth modifications can be obtained but also the distance between the control electrodes and the signal electrodes can be larger than that of the fourth and fifth modifications, so that the parasitic capacitance can be even smaller.

3. Still Another Embodiment

The varactor elements according to the embodiments described above are applicable to various electronic devices. In still another embodiment, a description is given to a configuration example in which a varactor element according to any of the embodiments described above of the present application is applied to an inverter circuit of a cold cathode fluorescent lamp (CCFL) backlight (electronic device) used for, for example, a liquid crystal television and the like.

Figure 26:
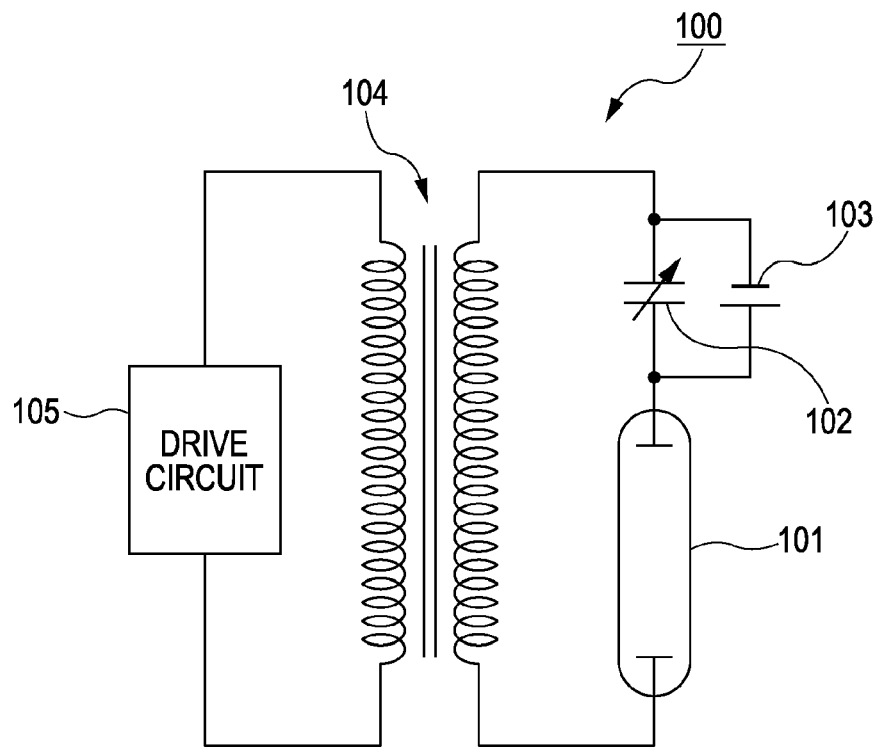
FIG. 26 is a schematic circuit configuration of the electronic device according to a still another embodiment.
Figure 27A:
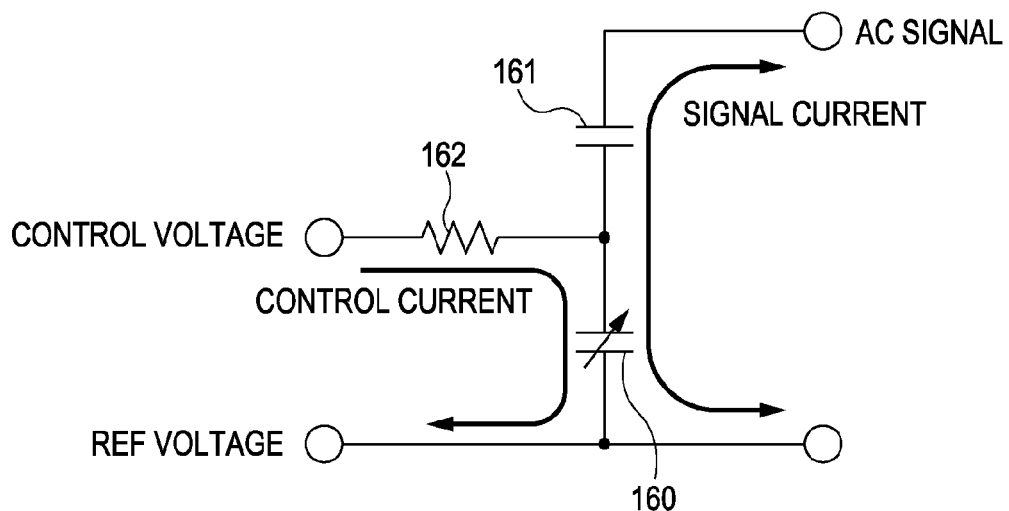
FIGS. 27A and 27B are circuit configurations in the vicinity of varactor capacitors in the past.
Figure 27B:
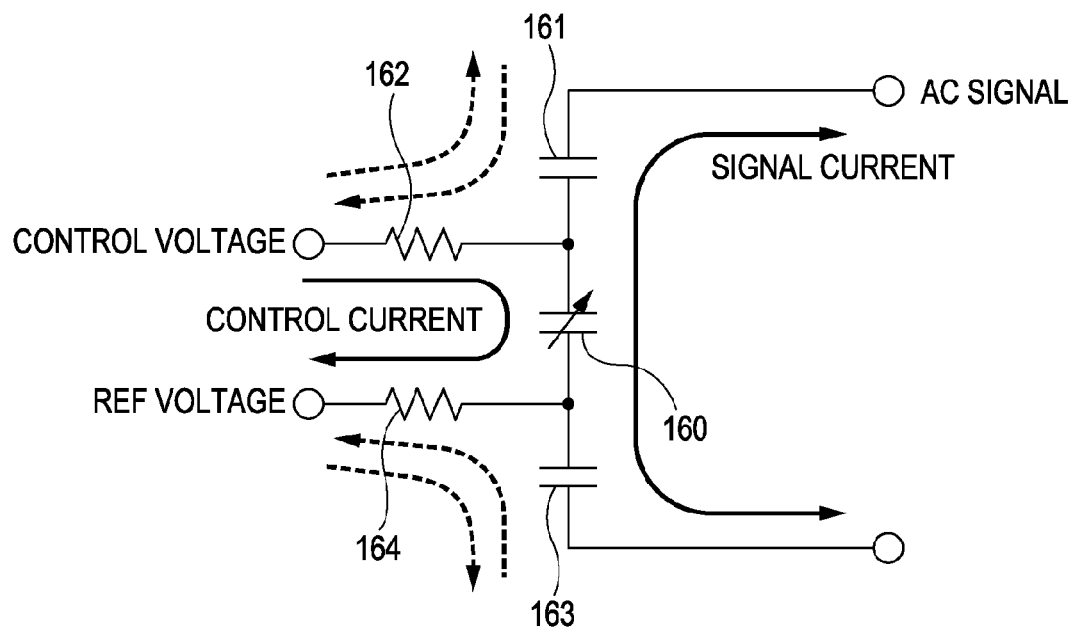
Figure 28A:
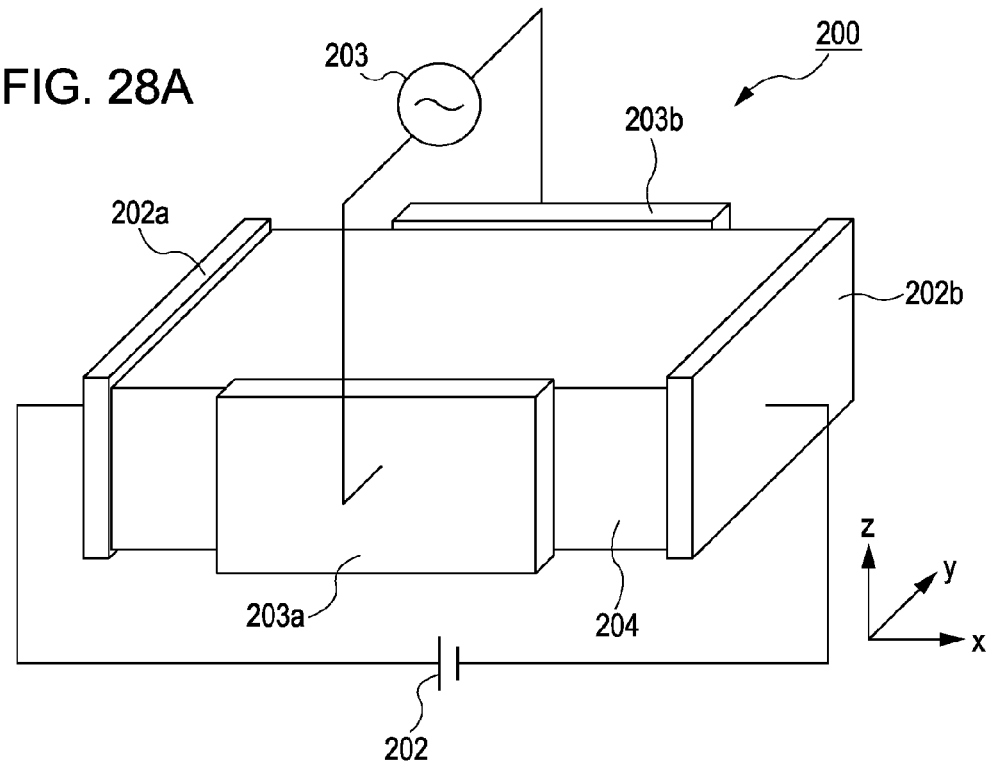
FIG. 28A is a schematic perspective view of a varactor element in the past.
Figure 28B:
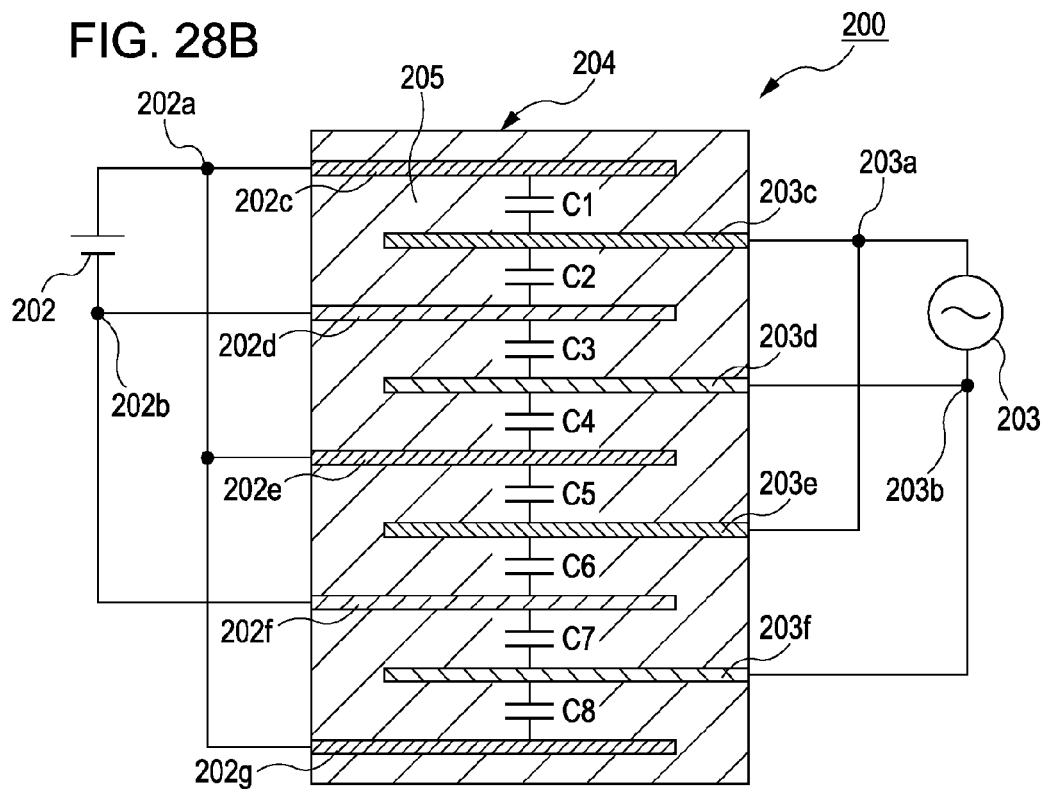
FIG. 28B is a cross-sectional configuration diagram of the varactor element in the past.
Figure 29:
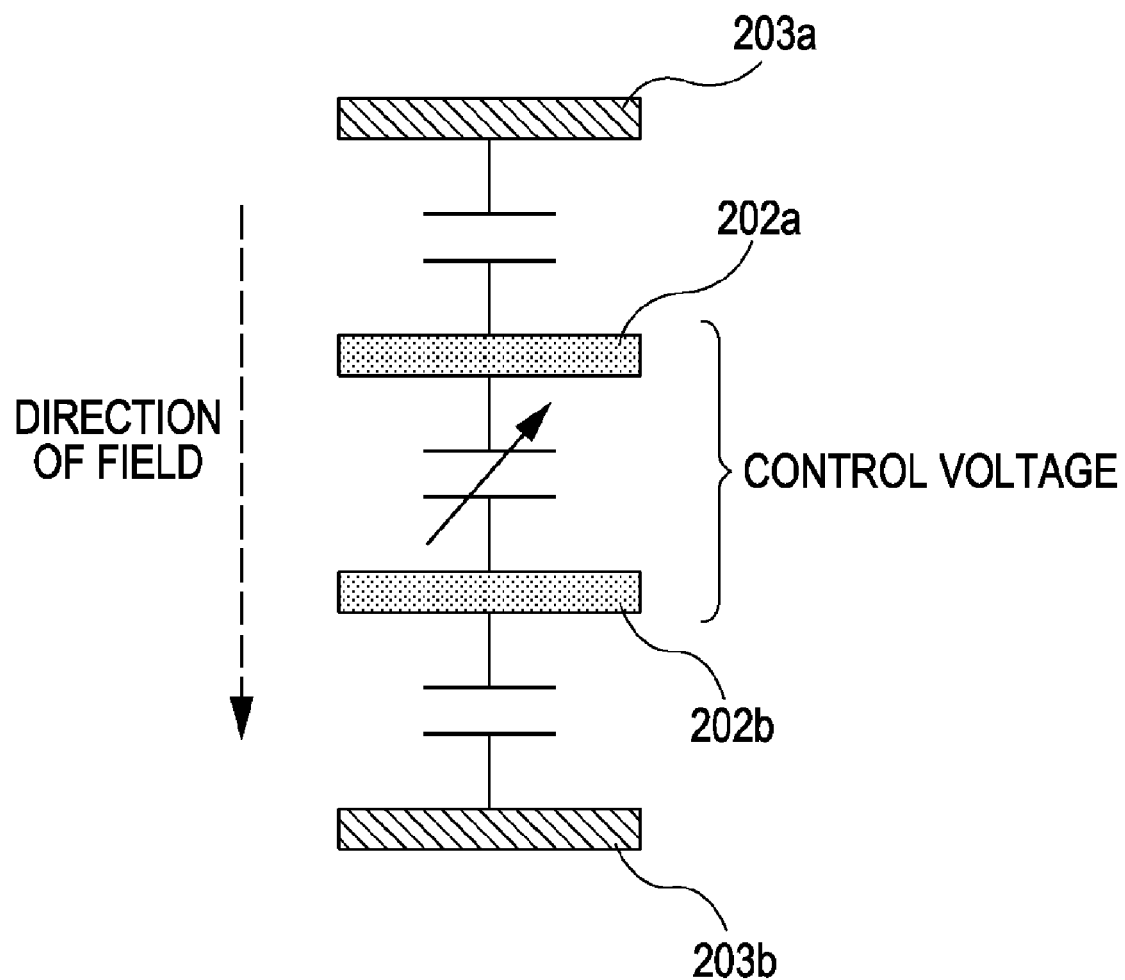
FIG. 29 illustrates a behavioral outline of the varactor element in the past.

FIG. 26 illustrates a schematic circuit configuration of an inverter circuit of a CCFL backlight according to this embodiment. An inverter circuit 100 is configured with, for example, a CCFL 101, a varactor element 102, a control voltage power source 103 (control voltage supply unit), a boost transformer 104, and a drive circuit 105.

The varactor element 102 can employ any of the four-terminal varactor elements described in the above embodiments and the first through fifth modifications. Although the varactor element 102 is illustrated as a two-terminal varactor capacitor in FIG. 26, it is actually provided with a pair of signal terminals (not shown) and a pair of control terminals (not shown).

One of the control terminals of the varactor element 102 is connected to a positive electrode terminal of the control voltage power source 103, and the other control terminal is connected to a negative electrode terminal of the control voltage power source 103. Then, the capacitance of the varactor element 102 is controlled by the control voltage power source 103. One of the signal terminals of the varactor element 102 is connected to one of the terminals of the CCFL 101, and the other signal terminal is connected to the boost transformer 104. The varactor element 102 illustrated in FIG. 26 acts as a ballast capacitor.

The other terminal of the CCFL 101 is connected to the boost transformer 104. The boost transformer 104 is connected by the drive circuit 105 and is driven by the drive circuit 105.

In the inverter circuit with a configuration as described above, a high pressure alternating current voltage that is boosted by the boost transformer 104 is applied to the CCFL 101 via the varactor element 102 configuring the ballast capacitor. The output voltage of the boost transformer 104 is usually an alternating current voltage at approximately 1500 V and 50 kHz and the current flowing to the CCFL 101 is 5 to 10 mA.

Although a configuration provided with one CCFL 101 is illustrated in the example of the inverter circuit illustrated in FIG. 26, the configuration may also have two CCFLs 101 driven in parallel. In this case, when driving the two CCFLs 101 in parallel, the varactor element 102 is used for separation of the two CCFLs 101. As an element having such a configuration, a transformer, for example, may also be used other than a capacitor.

Although the ballast capacitor is used in the CCFL backlight for lower costs, it has disadvantages of variation of the capacitance of the CCFL 101 and the differences of, for example, the stray capacitance with a peripheral metal, resulting in the current variation and the brightness unevenness in each CCFL 101.

In contrast to that, in this embodiment, a direct current voltage is applied from the control voltage power source 103 connected to the control terminals of the varactor element 102 acted as a ballast capacitor to adjust the capacitance value of the varactor element 102. Therefore, in the CCFL backlight having such a varactor element 102 mounted therein, the brightness of the CCFL 101 can be maintained evenly by adjusting the capacitance value of the varactor element 102.

In this embodiment, since any of the varactor elements described in the above embodiments and the first through fifth modifications is applied as the ballast capacitor, the varactor element can be driven at a low control voltage while maintaining the withstanding voltage of the signal terminals of the varactor element. For example, the capacitance value of the varactor element 102 can be adjusted with the control voltage of approximately $\frac{1}{100}$ to $\frac{1}{300}$ of the output voltage of the boost transformer 104.

In the varactor element 102 according to this embodiment, as described above, the signal terminals and the control terminals are provided independently. Therefore, even when a direct current voltage is applied to the control terminals of the varactor element 102 when adjusting the capacitance, the direct current voltage is not applied to the boost transformer 104 and the CCFL 101 that are connected to the signal terminals of the varactor element 102. Accordingly, in this embodiment, an excessive current does not flow in a transformer coil of the boost transformer 104 during the capacitance adjustment, and thus the capacitance can be adjusted by applying the control voltage to the varactor element 102 while the varactor element 102 is implemented.

The varactor elements according to the embodiments are also applicable to various electronic devices other than the electronic device mentioned in the still other embodiment above, and similarly, the capacitance can be adjusted to a desired value while the varactor element is implemented without affecting other circuits in the electronic device. For example, by using the varactor element according to the embodiments, it becomes possible to tune in tuning frequency drifts of the electronic device due to variations in components or the like upon shipping the electronic device.

In addition, in a case of applying any of the varactor elements according to the embodiments to, for example, a noncontact IC (integrated circuit) card and the like, the varactor element can also be used as a protective circuit. More specifically, a varactor element according to the embodiments can be used as a protective circuit not to break the control circuit formed of semiconductor devices having a low withstanding voltage due to an excessively large reception signal when a noncontact IC card is moved closer to the reader/writer. However, in this case, the direct current voltage obtained by rectifying the received alternating current signal is subjected to resistance division with, for example, a circuit connecting a plurality of resistors serially in the noncontact IC card, and the direct current voltage that is resistance divided is used for the control voltage of the varactor element.

That is, in the electronic device according to the embodiments, the supply mechanism of the control voltage of the varactor element (control voltage supply unit) is not limited to the control voltage power source described above in the embodiment described secondly. In case of applying the varactor element according to the embodiments as an electronic device, such as a noncontact IC card, for example, it is also possible to use a circuit that generates and supplies the control voltage from the inputted alternating current signal as a supply mechanism of the control voltage.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A varactor element, comprising:
    a dielectric layer;
    a pair of signal electrodes disposed in an interior portion of the dielectric layer, each signal electrode extending in a first direction, and disposed so that exterior ends of the signal electrodes are exposed on opposed exterior surfaces of the dielectric layer, and the signal electrodes extend toward one another to the interior of the dielectric layer so that opposed interior ends of the signal electrodes face each other with a first distance therebetween; and
    a pair of control electrodes disposed in the interior portion of the dielectric layer, each control electrode extending in a second direction perpendicular to the first direction, and disposed so that exterior ends of the control electrodes are exposed on opposed exterior surfaces of the dielectric layer, and the control electrodes extend toward one another to the interior of the dielectric layer so that opposed interior ends of the control electrodes face each other with a second distance therebetween.

2. The varactor element according to claim 1, wherein the first distance between the pair of signal electrodes is different from the second distance between the pair of control electrodes.

3. The varactor element according to claim 2, wherein the first distance between the pair of signal electrodes is larger than the second distance between the pair of control electrodes.

4. The varactor element according to claim 1, wherein the dielectric layer is formed of a dielectric material having a permittivity varied by an application of a direct current voltage.

5. An electronic device, comprising:
    a varactor element having a dielectric layer, a pair of signal electrodes disposed in an interior portion of the dielectric layer, each signal electrode extending in a first direction, and disposed so that exterior ends of the signal electrodes are exposed on opposed exterior surfaces of the dielectric layer, and the signal electrodes extend toward one another to the interior of the dielectric layer so that opposed interior ends of the signal electrodes face each other with a first distance therebetween, and a pair of control electrodes disposed in the interior portion of the dielectric layer, each control electrode extending in a second direction perpendicular to the first direction, and disposed so that exterior ends of the control electrodes are exposed on opposed exterior surfaces of the dielectric layer, and the control electrodes extend toward one another to the interior of the dielectric layer so that opposed interior ends of the control electrodes face each other with a second distance therebetween; and
    a control voltage supply unit supplying a control voltage to the pair of control electrodes.

\* \* \* \* \*